US011264472B2

(12) United States Patent
Bhattacharyya

(10) Patent No.: US 11,264,472 B2
(45) Date of Patent: Mar. 1, 2022

(54) MEMORY CONFIGURATIONS

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/937,243

(22) Filed: Jul. 23, 2020

(65) Prior Publication Data

US 2020/0357890 A1 Nov. 12, 2020

Related U.S. Application Data

(62) Division of application No. 16/133,016, filed on Sep. 17, 2018, now Pat. No. 10,741,658, which is a division of application No. 15/641,628, filed on Jul. 5, 2017, now Pat. No. 10,153,348.

(51) Int. Cl.
| | | |
|---|---|---|
| *H01L 29/423* | (2006.01) | |
| *H01L 27/11521* | (2017.01) | |
| *H01L 27/11568* | (2017.01) | |
| *H01L 29/66* | (2006.01) | |
| *H01L 21/28* | (2006.01) | |
| *H01L 29/792* | (2006.01) | |
| *H01L 27/11582* | (2017.01) | |

(52) U.S. Cl.
CPC .. *H01L 29/42324* (2013.01); *H01L 27/11521* (2013.01); *H01L 27/11568* (2013.01); *H01L 29/40117* (2019.08); *H01L 29/4234* (2013.01); *H01L 29/42344* (2013.01); *H01L 29/66833* (2013.01); *H01L 29/7926* (2013.01); *H01L 27/11582* (2013.01)

(58) Field of Classification Search
CPC ......... H01L 27/11521; H01L 27/11582; H01L 27/11568; H01L 29/40117; H01L 29/42324; H01L 29/4234; H01L 29/42344; H01L 29/66833; H01L 29/7926
USPC .................................................. 257/324, 326
See application file for complete search history.

(56) References Cited

U.S. PATENT DOCUMENTS

| | | |
|---|---|---|
| 4,870,470 A | 9/1989 | Bass et al. |
| 6,743,681 B2 | 6/2004 | Bhattacharyya |
| 6,743,682 B2 | 6/2004 | Woerlee et al. |
| 6,888,200 B2 | 5/2005 | Bhattacharyya |
| 6,903,969 B2 | 6/2005 | Bhattacharyya |
| 6,917,078 B2 | 7/2005 | Bhattacharyya |
| 6,998,667 B2 | 2/2006 | Bhattacharyya |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Matthew E Warren
(74) *Attorney, Agent, or Firm* — Brooks Cameron & Huebsch, PLLC

(57) ABSTRACT

In an example, a memory may have a group of series-coupled memory cells, where a memory cell of the series-coupled memory cells has an access gate, a control gate coupled to the access gate, and a dielectric stack between the control gate and a semiconductor. The dielectric stack is to store a charge.

20 Claims, 8 Drawing Sheets

(56) References Cited

U.S. PATENT DOCUMENTS

| | | | |
|---|---|---|---|
| 7,012,297 B2 | 3/2006 | Bhattacharyya | |
| 7,042,027 B2 | 5/2006 | Bhattacharyya | |
| 7,130,216 B2 | 10/2006 | Bhattacharyya | |
| 7,145,186 B2 | 12/2006 | Bhattacharyya | |
| 7,158,410 B2 | 1/2007 | Bhattacharyya et al. | |
| 7,166,888 B2 | 1/2007 | Bhattacharyya | |
| 7,184,312 B2 | 2/2007 | Bhattacharyya | |
| 7,208,793 B2 | 4/2007 | Bhattacharyya | |
| 7,224,002 B2 | 5/2007 | Bhattacharyya | |
| 7,244,981 B2 | 7/2007 | Bhattacharyya | |
| 7,250,628 B2 | 7/2007 | Bhattacharyya | |
| 7,273,784 B2 | 9/2007 | Bhattacharyya | |
| 7,276,760 B2 | 10/2007 | Bhattacharyya | |
| 7,279,740 B2 | 10/2007 | Bhattacharyya et al. | |
| 7,339,239 B2 | 3/2008 | Forbes | |
| 7,339,830 B2 | 3/2008 | Bhattacharyya | |
| 7,349,252 B2 | 3/2008 | Bhattacharyya et al. | |
| 7,365,388 B2 | 4/2008 | Bhattacharyya | |
| 7,379,336 B2 | 5/2008 | Bhattacharyya et al. | |
| 7,385,245 B2 | 6/2008 | Bhattacharyya | |
| 7,400,012 B2 | 7/2008 | Bhattacharyya | |
| 7,403,416 B2 | 7/2008 | Bhattacharyya et al. | |
| 7,417,893 B2 | 8/2008 | Bhattacharyya et al. | |
| 7,429,767 B2 | 9/2008 | Bhattacharyya | |
| 7,432,562 B2 | 10/2008 | Bhattacharyya | |
| 7,436,018 B2 | 10/2008 | Bhattacharyya | |
| 7,440,310 B2 | 10/2008 | Bhattacharyya | |
| 7,440,317 B2 | 10/2008 | Bhattacharyya | |
| 7,456,054 B2 | 11/2008 | Bhattacharyya | |
| 7,457,159 B2 | 11/2008 | Bhattacharyya et al. | |
| 7,459,740 B2 | 12/2008 | Bhattacharyya et al. | |
| 7,476,927 B2 | 1/2009 | Bhattacharyya | |
| 7,482,651 B2 | 1/2009 | Bhattacharyya | |
| 7,485,513 B2 | 2/2009 | Bhattacharyya | |
| 7,525,149 B2 | 4/2009 | Bhattacharyya et al. | |
| 7,528,043 B2 | 5/2009 | Bhattacharyya | |
| 7,544,990 B2 | 6/2009 | Bhattacharyya | |
| 7,553,735 B2 | 6/2009 | Bhattacharyya | |
| 7,579,242 B2 | 8/2009 | Bhattacharyya | |
| 7,612,403 B2 | 11/2009 | Bhattacharyya | |
| 7,625,803 B2 | 12/2009 | Bhattacharyya | |
| 7,629,641 B2 | 12/2009 | Bhattacharyya | |
| 7,662,693 B2 | 2/2010 | Bhattacharyya | |
| 7,671,407 B2 | 3/2010 | Bhattacharyya | |
| 7,728,350 B2 | 6/2010 | Bhattacharyya | |
| 7,749,848 B2 | 7/2010 | Bhattacharyya et al. | |
| 7,750,395 B2 | 7/2010 | Bhattacharyya | |
| 7,759,715 B2 | 7/2010 | Bhattacharyya | |
| 7,768,062 B2 | 8/2010 | Bhattacharyya et al. | |
| 7,786,516 B2 | 8/2010 | Bhattacharyya | |
| 7,838,362 B2 | 11/2010 | Bhattacharyya | |
| 7,851,827 B2 | 12/2010 | Bhattacharyya | |
| 7,867,850 B2 | 1/2011 | Bhattacharyya | |
| 7,898,022 B2 | 3/2011 | Bhattacharyya | |
| 7,956,426 B2 | 6/2011 | Bhattacharyya | |
| 7,964,909 B2 | 6/2011 | Bhattacharyya | |
| 7,968,402 B2 | 6/2011 | Bhattacharyya | |
| 8,058,118 B2 | 11/2011 | Bhattacharyya | |
| 8,063,436 B2 | 11/2011 | Bhattacharyya | |
| 8,125,003 B2 | 2/2012 | Bhattacharyya | |
| 8,143,657 B2 | 3/2012 | Bhattacharyya | |
| 8,159,875 B2 | 4/2012 | Bhattacharyya | |
| 8,193,568 B2 | 6/2012 | Bhattacharyya | |
| 8,228,743 B2 | 7/2012 | Min et al. | |
| 8,242,554 B2 | 8/2012 | Bhattacharyya | |
| 2006/0258090 A1* | 11/2006 | Bhattacharyya | H01L 27/115 438/257 |
| 2006/0261401 A1* | 11/2006 | Bhattacharyya | H01L 29/513 257/316 |
| 2007/0034922 A1 | 2/2007 | Bhattacharyya | |
| 2007/0052011 A1* | 3/2007 | Bhattacharyya | B82Y 10/00 257/324 |
| 2008/0303080 A1 | 12/2008 | Bhattacharyya | |
| 2009/0045452 A1* | 2/2009 | Lue | G11C 16/0466 257/321 |
| 2010/0090265 A1 | 4/2010 | Bhattacharyya et al. | |

OTHER PUBLICATIONS

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

Lee et al., Effect of Polysilicon Gate on the Flatband Voltage Shift and Mobility Degradation for ALD-Al2O3 Gate Dielectric, IEEE International Electron Devices Meeting (IEDM) 2000, Dec. 10-13, 2000, San Francisco, CA, pp. 645-648.

(56) References Cited

OTHER PUBLICATIONS

Lue et al., "A Novel P-Channel NAND-type Flash Memory with 2 bit/cell Operation and High Programming Throughput (>20 Mb/sec)", IEEE International Electron Devices Meeting (IEDM) 2005, Dec. 5-7, 2005, Washington, D.C., 4 pages.

Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.

Luo et al., "Design of High Performance PFETs with Strained Si Channel and Laser Anneal", IEEE International Electron Devices Meeting (IEDM) 2005, Dec. 5-7, 2005, Washington D.C., pp. 495-498.

Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.

Manchanda et al., "Si-Doped Aluminates for High Temperature Metal-Gate CMOS: Zr—AlSi—O, a Novel Gate Dielectric for Low Power Applications", IEEE International Electron Devices Meeting (IEDM) 2000, Dec. 10-13, 2000, San Francisco, CA, pp. 23-26.

Mayuzumi et al., "Extreme High Performance n- and p-MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.

Moon et al., "Multi-Functional Universal Device using a Band-Engineered Vertical Structure", IEEE International Electron Devices Meeting (IEDM) 2011, Dec. 5-7, 2011, Washington D.C., pp. 551-554.

Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.

Oh et al., "4-bit Double SONOS Memories (DSMs) Using Single-Level and Multi-Level Cell Schemes", IEEE International Electron Devices Meeting (IEDM) 2006, Dec. 11-13, 2006, San Francisco, CA, pp. 967-970.

Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.

Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.

Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.

Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.

Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.

Taguchi, "NOR Flash Memory Technology", presented at 2006 IEEE International Electron Devices Meeting (IEDM) Short Course on Memory Technologies for 45nm and Beyond, Dec. 2006, 27 pages.

Wang et al., "Fast Erasing and Highly Reliable MONOS Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.

Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.

Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.

Zhang et al., Novel ZrO2/Si3N4 Dual Charge Storage Layer to Form Step-up Potential Wells for Highly Reliable Multi-level Cell Application', IEEE International Electron Devices Meeting (IEDM) 2007, Dec. 10-12, 2005, Washington D.C., pp. 83-86.

Likharev, "Riding the Crest of a New Wave in Memory", IEEE Circuits and Devices Magazine, vol. 16, Issue 4, Jul. 2000, pp. 16-21.

Ramaswamy et al., "Engineering a Planar NAND Cell Scalable to 20nm and Beyond", 2013 5th IEEE Memory Workshop, May 26-29, 2013, Monterey, CA, pp. 5-8.

Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

\* cited by examiner

US 11,264,472 B2

MEMORY CONFIGURATIONS

PRIORITY INFORMATION

This application is a Divisional of U.S. application Ser. No. 16/133,016, filed Sep. 17, 2018, which is a Divisional of U.S. application Ser. No. 15/641,628, filed Jul. 5, 2017, issued U.S. Pat. No. 10,153,348 on Dec. 11, 2018, the entire contents of which are included herein by reference.

TECHNICAL FIELD

The present disclosure relates generally to memories, and, more particularly, to memory configurations.

BACKGROUND

Memory is sometimes implemented in electronic systems, such as computers, cell phones, hand-held devices, etc. There are many different types of memory, including volatile and non-volatile memory. Volatile memory may require power to maintain its data and may include random access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), or the like. Hard disc drives (HDDs) may be an example of another type of memory and may include magnetic tapes and/or optical discs.

Some electronic systems may include a processor (e.g., for controlling the electronic system). For example, some processors may include SRAM. In some examples, a processor may include a cache memory that may be an SRAM or a DRAM.

The processor may be coupled to data storage devices, such as solid-state-data-storage devices (e.g., sometimes called solid-state drives (SSDs)) and/or hard disc drives. For example, a solid-state-data-storage device might include NAND flash memory, NOR flash memory, and/or NROM.

In some examples, a NAND memory may include groups (e.g., strings) of series-coupled (e.g., one-transistor) non-volatile memory cells. The series-coupled memory cells in a string, for example, may be between a data line (e.g., a bit line) and a source. For example, the memory cells in a string may be coupled in series source to drain. Memory cells at common locations in the strings, for example, may be commonly coupled to an access line, such as a word line.

DETAILED DESCRIPTION

Figure 1:
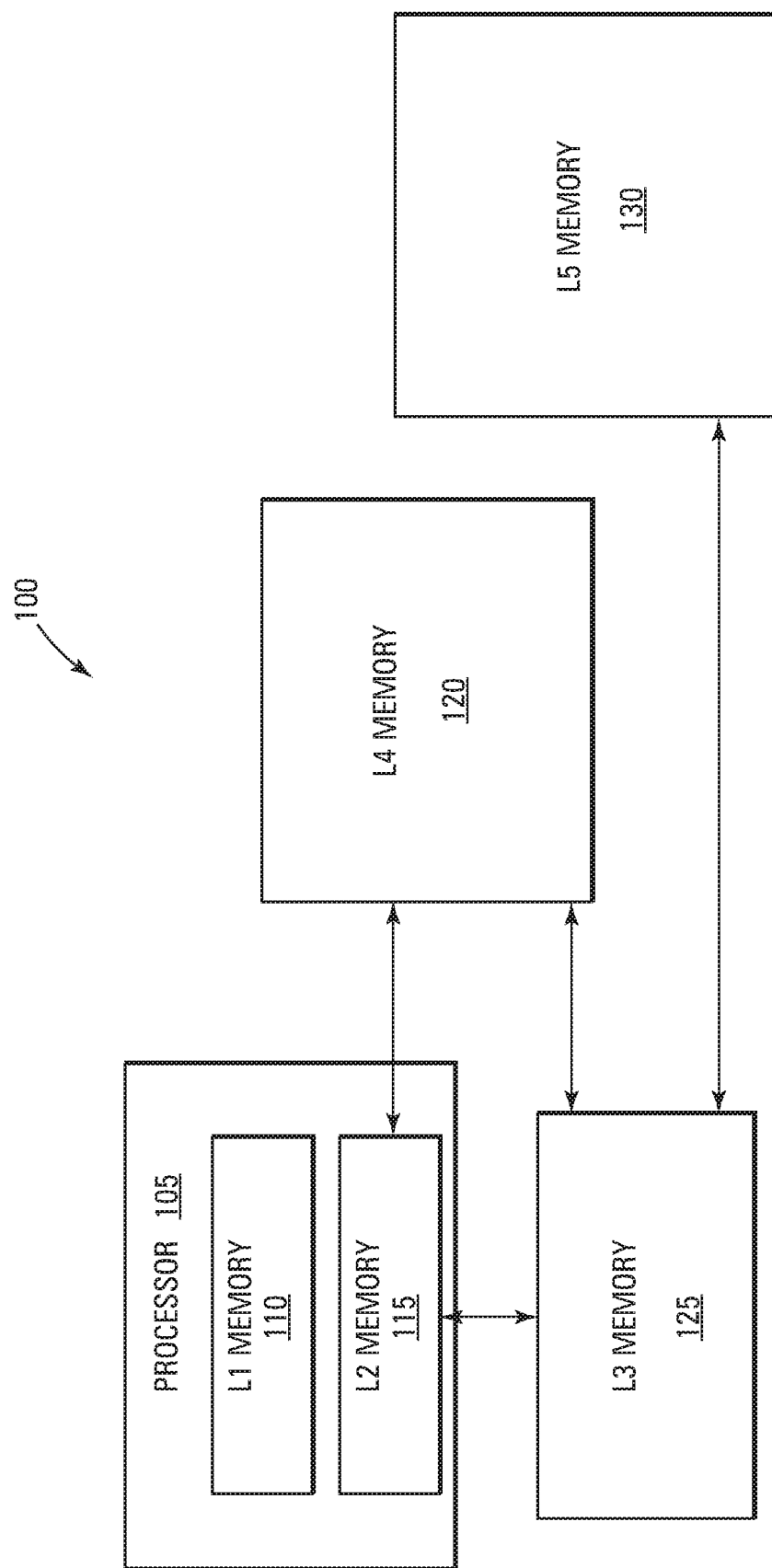
FIG. 1 is a block diagram that illustrates an example of an apparatus in accordance with a number of embodiments of the present disclosure.

In an example, a memory may have a group of series-coupled memory cells, where a memory cell of the series-coupled memory cells has an access gate, a control gate coupled to the access gate, and a dielectric stack between the control gate and a semiconductor. The dielectric stack is to store a charge.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

It should be noted, for example, that although some of the examples herein may be discussed in the framework of split-gate structures, the stack designs to be detailed herein may be applicable for single-transistor and two-transistor memory cells.

Figure 5A:
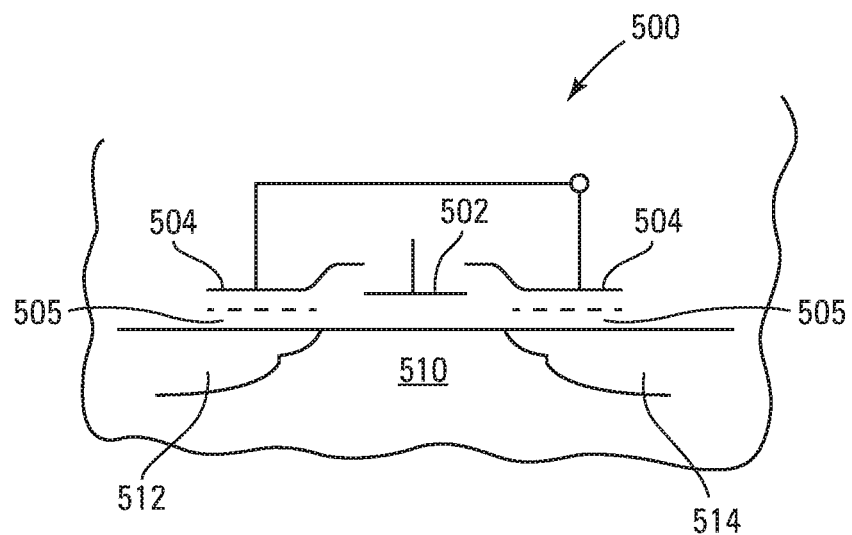
FIG. 5A is a schematic diagram of an example of a split-gate memory cell in accordance with a number of embodiments of the present disclosure.
Figure 5B:
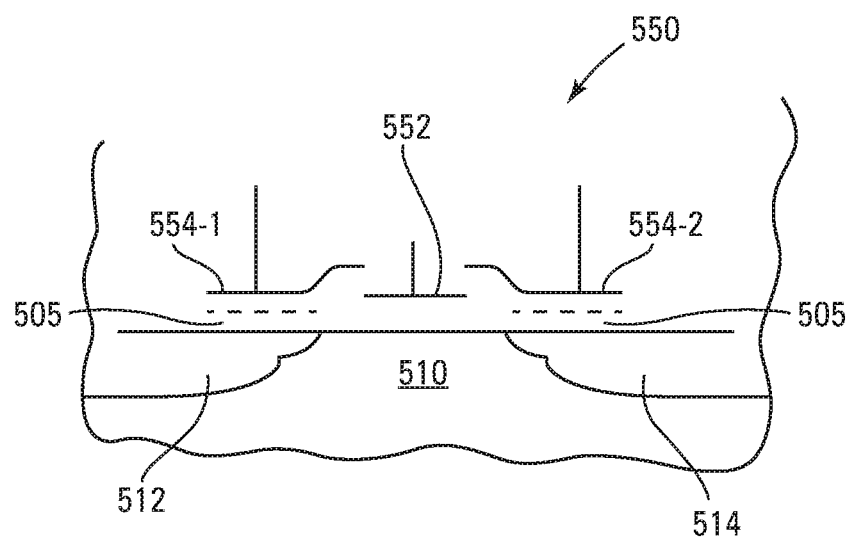
FIG. 5B is a schematic diagram of another example of a split-gate memory cell in accordance with a number of embodiments of the present disclosure.

In some examples, a memory cell of a group of series-coupled memory cells may be as shown in the example of FIG. 5A, a schematic diagram of memory cell 500, such as a split-gate memory cell, or in the example of FIG. 5B, a schematic diagram of memory cell 550, such as a split-gate memory cell. For example, memory cell 500 may have an access gate 502 and a single control gate 504 (e.g., capacitively) coupled to the access gate. A memory cell 550 may have an access gate 552 (e.g., capacitively) coupled to separate control gates 554-1 and 554-2. A dielectric stack 505 may be between the control gate 504 and a semiconductor 510 and between each of the control gates 554-1 and 554-2 and the semiconductor 510 and may be designed to store a certain (e.g., well-defined) amount of charge to provide one or more units of memory storage capacity. In some examples, a group of series-coupled memory cells may be called a (e.g., bit) string. For example, a memory may include a plurality of bit strings, each which may be identified and accessed separately. The strings may be sensed in logical NAND form, hence for example, the name NAND memory. A certain number of bit strings, each containing a set of data may also be accessed in parallel, if required.

In some examples, a memory cell, such as memory cell 500 or 550, of a group of series-coupled memory cells may be a non-volatile memory cell that may have characteristics of an integrated form of a two-transistor version of a non-volatile memory cell. For example, a two-transistor non-volatile memory cell may have an access gate, such as an access gate 502 or 552, of a fixed-threshold-voltage (Vt) (e.g., to within routine variations of the Vt) FET, that may be called an access device, in series with a variable-threshold-voltage FET element, such as a variable-threshold-voltage FET, (e.g., that may have a gate stack to store charge). In some examples, an integrated form of a two-transistor memory device, may be created where both the access gate and the control gate may be mutually (e.g., capacitively) coupled and may jointly control a channel in a semiconductor, such as semiconductor 510, to function as a field-effect transistor. For example, such an integrated device may be called a "split-gate non-volatile memory" device or interchangeably a "split-channel non-volatile memory" device.

Memory cells 500 and 550 in FIGS. 5A and 5B are examples of such devices. For example, the control gate 504 and the control gates 554-1 and 554-2 may be placed over source/drains 512 and 514 (e.g., that may act as carrier source/drains) In some examples, the non-volatile memory cell field-effect characteristics may operate due to the combined action of the access gate 502/554 of a fixed-threshold-voltage element being in series with the control gate 504/554 of a variable-threshold-voltage element to influence the semiconductor channel characteristics. The combined action may be required for non-volatile memory operations of establishing memory states, for example, binary memory states of "1" (write-state) or "0" (erase-state) called programming and sensing such memory states called reading.

There may be a plurality of the split-gate type of memory cell configurations. An advantage of such configurations, for example, may be over-erasure protection and consequently a relatively tighter distribution of the lowest state, such as the erase (e.g., "0" or "00" or "000" for 1-bit, 2-bit, or 3-bit storage respectively) memory state, for the memory array. Single-transistor series-coupled memory cells may provide a relatively high linear density bit string, whereby the gate of such memory cells (e.g., FET memory cells) may act as both an access gate and a control gate. However, such a configuration may not provide much over erase protection, for example, that may result in less robust multilevel cell (MLC) designs.

Groups of series-coupled memory cells, such as in NAND, may provide, for example, a relatively high memory density (e.g. the highest memory density for all memory cells) at the expense of performance, since the memory bits may need to be accessed serially within each string. It should be pointed out, for example, that some of the uni-functional silicon-based-unified memory (USUM) concepts presented in the examples herein may be applicable to the types of memory cells mentioned above by incorporating certain (e.g., unique) stack designs to provide MLC capability for systems, such as digital memory systems. The USUM cells in the examples herein may be implementable with common scaled CMOS technology.

Memory cells in an array architecture, for example, may be programmed to a target (e.g., a desired) memory state. For example, electric charge may be placed on or removed from a charge storage structure (e.g., floating gate, or a floating plate or a charge trapping layer) of a field effect transistor (FET) based memory cell to program the cell to a particular data state. The amount of stored charge on the charge storage structure of a FET-based memory cell may be indicated by means of a resulting threshold voltage (Vt) state of the memory cell.

For example, a single level memory cell (SLC) may be programmed to a targeted one of two different data states, which can be represented by the binary units 1 or 0. A binary data state represents 1 bit of data with $2^1=2$ data states. Similarly, for example, four memory states such as 00, 10, 01, and 11 representing $2^2=4$, may store 2 bits of data. As an additional example, some memory cells may be programmed to four bits of data with $2^4=16$ data states (e.g., 1111, 0111, 0011, 1011, 1001, 0001, 0101, 1101, 1100, 0100, 0000, 1000, 1010, 0010, 0110, and 1110). Such cells, for example, may be referred to as multistate memory cells (e.g., multiunit cells or multilevel cells (MLCs)). MLCs may provide higher density memories without increasing the number of memory cells since each cell can represent multiple bits of data storage. An MLC cell, for example, may provide higher capacity of data storage.

Embodiments of the present disclosure may provide benefits, such as increased bit densities by providing MLC characteristics as above while possibly avoiding (e.g., eliminating) short-channel effects. When feature sizes for the FET dimensions, such as the channel length of one-transistor memory cells, are scaled, for example, to seek higher bit densities for a memory chip, short-channel effects may render memory cells inoperable due not only excessive and unacceptable device leakage, but also due to the inability to discriminate the memory states. By employing the integrated two-transistor memory cells and by employing a vertical channel implementation of such cells to provide channel length flexibility, feature sizes may be scaled down to the scalability limit (e.g., sub 10 nanometer dimension), reducing (e.g., avoiding) the short channel effects while implementing MLC capability with certain (e.g., novel) gate stack designs. This may provide an increased bit density that may not be available using existing technology.

The lowest data state, such as the erase state, of the memory cells in some embodiments may be more stable (e.g., with a smaller threshold-voltage range) range) than conventional memory cells (e.g., the number of under and/or over erasures may be reduced compared to conventional memory cells). This may significantly aid MLC design with the proposed stack structures in a number of embodiments of the present disclosure. Additional benefits may include, for example, reduced programming voltages, higher data retention, increased endurance, and reduced energy consumption, as compared to various prior approaches.

FIG. 1 is a block diagram that illustrates an example of an apparatus in the form of an electronic system 100 in accordance with a number of embodiments of the present disclosure. System 100 can be, for example, a computer system, a memory system, a hand-held device, a cell phone, etc. FIG. 1 illustrates an example of a memory hierarchy associated with electronic system 100. In this example, the memory hierarchy may include levels L1 to L5. As an example, levels L1 to L5 may be defined by memory characteristics (e.g., access speed, and or cycle speed, and or the data throughput, memory cell size, reliability, endurance, volatility, memory-window size, etc.). For example, in going from level L1 to level L5, the access speed, and the cycle speed, and the data throughput may progressively decrease, while the nonvolatility and storage capacity of the memory type may increase.

Note that the data access speed, for example, may be related to the read access time of the memory that implies the time it takes to ensure the binary ("1" or "0") state of any particular memory bit within a memory array (e.g., the higher the access speed, the lower the access time). For example, the cycle time may imply the time it takes to not only establish the binary memory state of any storage bit (either 1, or 0) through programming ("write" and or "erase") of the specific bit within the memory array, but also the time to ensure the memory state which is the access time. Memory delay (e.g., memory latency) may imply the time it takes for the memory bit to arrive at the processor node once the processor fetches the memory bit triggered by a unit of a clock cycle of the processor, for example. Memory bandwidth (e.g., memory throughput), for example, may be related and inversely proportional to the memory latency. The higher the memory bandwidth, for example, the lower the delay and lower the memory cycle time. For example, the data throughput may be inversely related to the data cycle time combined with the data transfer time to the processor, where the data transfer time to the processor may be dependent on the design of the memory output system and the transfer mode. Therefore, when memory with lower latency (e.g., a lower cycle time) may be employed, for example, the processor may execute an assigned task (e.g. any specific function or program) faster and the performance of a system (e.g., digital system) may be improved.

Memory volatility may be related to two aspects of retention of the memory state of any memory bit. One aspect of retention may be the retention of a memory state when the power is available to the memory array, implying that no re-writing (e.g., refreshing), such as re-establishing, the memory state is required during a time period. This aspect of retention may be longer for SRAM and shorter (in the order of milliseconds) for DRAM. Therefore, DRAM may require frequent refreshing of a memory state even when the power is on for the memory array. The other aspect of memory retention, for example, may be the ability to retain a written (e.g., established) memory state of any bit when there is no power to the memory array. Memory state retention of this type might be about 10 years for some nonvolatile memories of some SSDs (NROMs or NAND types of memory cells) and HDDs (magnetic tapes or disks).

When power is not available, for example, the memory states of SRAMs and DRAMs may be lost. Therefore, these types of memories may be classified as volatile memories. For non-volatile memories, for example, the lower the degree of volatility, the longer the memory retains data, and thus the greater the retention. For example, SDDs may, in general, be less nonvolatile compared to HDDs, where HDDs could retain data for centuries in properly stored environment. Silicon-based non-volatile memories may vary significantly in memory retention, depending on the memory type (NROM or NAND Flash), the memory cell attributes, and the detailed stack structure of the memory cell design. Some memory cell designs of NROMs and NAND, for example, may have at least one year of nonvolatility for most of the applications for which such memories are employed.

Another important property of memory, for example, may be the number of times memory binary states may be "written" or altered or "programmed" during the life time of the electronic system. In some examples, systems, such as memory systems, may be assumed to last for about 10 years, during which some memory bits may be altered for as many as million trillion times (1E15 times). The SRAMs and DRAMs, might, for example, withstand such re-programming known as "endurance." Endurance limits of some NROMs, for example, may be about 10 million times, while those of some NAND flash memories may be about 100,000 times to about one million times. This may limit the application of current NROMs and NANDs for L1, L2, and L3 memory applications, besides their significantly slower cycle time compared to SRAMs and DRAMs.

Electronic system 100 may include a processor 105, such as a microprocessor, that may control electronic system 100. Processor 105 may include a memory 110, such as a logic memory, having a memory level L1. For example, a conventional L1-level memory may be an SRAM volatile memory. Processor 105 may also include a memory 115, such as a cache memory, that may have a memory level L2, for example. An example of a conventional L2-level memory may be an SRAM volatile cache memory.

Advantages of SRAM may include, for example, high performance (e.g., high data throughput), and high endurance required for L1/L2-level functionality, and ease of fabrication (e.g., that may be compatible with complementary-metal-oxide-semiconductor (CMOS) fabrication techniques). Disadvantages of SRAM may include, limiting memory capacity, due, for example, to relatively large memory cell sizes (e.g., with a form factor F×F of about 50 to about 80) and volatility.

Memory 115 may be coupled to a memory 120, as shown in FIG. 1. Memory 115 may also be coupled to a memory 125, and memory 125 may be coupled to memory 120, for example. The term "coupled" may include directly coupled and/or directly connected with no intervening elements (e.g., by direct physical contact) or indirectly coupled and/or connected with intervening elements.

Memory 125 may be a main memory (e.g., a working memory) and may have a memory level L3. An example of a conventional L3-level memory may be a DRAM volatile memory. Advantages of DRAM, for example, may include relatively higher performance compared to non-volatile memories (e.g., read, write, and erase times of less than about 10 nanoseconds), relatively small (e.g., an F×F of about 6 to about 8) one-transistor-one-capacitor memory cells, yielding higher capacity, and relatively higher performance with lower cycle time to provide L3-level functionality. DRAM, for example, may provide relatively high endurance at the expense of power consumption for frequent refreshing of the memory states. Disadvantages of DRAM may include, for example, fabrication (e.g., customized CMOS fabrication for the capacitor may be required), scalability (e.g., may be difficult to scale to below 30 nanometers), and volatile memory cells (e.g., data may need to be refreshed about every millisecond).

Memory 120 may be a storage memory (e.g., for storing data and/or code) and may have a memory level L4. Examples of L4-level memory may include non-volatile NOR memory, non-volatile NAND memory, and non-volatile NROM. In some examples, memory 120 may be referred to as a solid-state memory.

Advantages of NROM (e.g., NROM flash) may include, for example, relatively high read performance (e.g., fast reads), non-volatile memory cells, relatively small (e.g., an F×F of about 6) random-access-one-transistor memory cells, multiple-bit-per cell storage capability, built-in-operating-system (BIOS) functionality, code storage capability, and fabrication (e.g., compatible with CMOS fabrication techniques). Disadvantages of NROM may include, for example, relatively slow writes, relatively high programming voltages, relatively low read/write endurance, and relatively poor durability.

Advantages of NAND (e.g., NAND flash) may include, for example, small (e.g., an F×F of about 4) one-transistor memory cells with single-bit- and multiple-bit-per cell storage capability, non-volatile memory cells, and high storage capacity per $mm^2$ of silicon. Disadvantages of NAND may include, for example, relatively slow write speeds (e.g., about 1.0 to about 10 millisecond), relatively slow access (e.g., serial/parallel memory access), and relatively low write/erase (W/E) endurance (e.g., about $10^3$ to about $10^5$ W/E cycles).

Memory 125 may be coupled to a memory 130, having a memory level L5, for example. Examples of conventional L5-level memories may include magnetic memory (e.g., magnetic tapes) and/or optical memory (e.g., optical discs) for storing data. In some examples, memory 130 may be referred to as an HDD memory. Advantages of magnetic memory may include, for example, non-volatility, high-density storage, low cost, high capacity, and L5-level functionality. Disadvantages of magnetic memory may include, for example, speed (e.g., long access and cycle times), relatively poor reliability, and moving mechanical parts.

A memory hierarchy, such as that described above, may advantageously employ, for example, the memories described above, such as the L1- to L5-level memories (e.g., SRAM, DRAM, NROM, NAND, and HDD) to fulfill system functionality objectives with cost, capability, power, performance, form-factor, portability, and applications in mind. The hierarchy may require communication between various memories and, therefore, for example, may disadvantageously involve a significant amount of peripheral logic, power, cost, performance compromises, form-factor constraints, reliability issues, and durability issues. The hierarchical approach may add additional burdens related to connectivity of memory levels, such as interconnections and packaging requirements unique to each type of memory and increased burden of testing. This, for example, may suggest a "one-type-fits-all" approach to memory design (e.g., a novel one-type-fits-all memory). Except for HDD, some processors and memories may (e.g., all) be silicon based, and the memory cell structure may (e.g., all) be similar and may be built using scaled CMOS field-effect transistor technology, for example.

There may be a need for memories that might include silicon-based-non-volatile-one-transistor memory cells that may satisfy the speed, power, and/or capacity requirements of L1-, L2-, L3-, L4-, and L5-level memories. For example, there may be a need for one type of memory cell that may satisfy the speed, power, and/or capacity requirements of L1-, L2-, L3-, L4-, and L5-level memories. There may be a need, for example, for unified technology integration with CMOS logic, such as unified fabrication techniques (e.g., that may be compatible with CMOS fabrication techniques). There may be a need, for example, for scalable and lower-power memories (e.g., memory cells) with higher reliability and durability. There may be a need for all memories to maintain the information or data when there is a loss of power. There may be a need, for example, to do away with the conventional memory hierarchy (e.g., in favor of a non-hierarchical organization) that may result in faster communication with the processor. There may also be a need to reduce interconnections, unique packaging and testing requirements, and associated energy requirements.

Conventional memory requirements and selection, in general, may be based on application, capacity, and power requirements, cost, portability, form factor, and system performance/execution requirements. Some memory parameters, for example, may be cost, form factor, package density, and power consumption. Another parameter in selecting specific memory types and organizing memory use in a specific system, such as electronic system 100, may be data throughput, such as cycle time. For example, data throughput may depend on the intrinsic characteristics of the memory cell.

Cycle time, as mentioned earlier, may strongly impact the time it may take for the processor to fetch a specific bit of data from a specific memory array. Examples of estimated cycle times may include, for example, about 0.5 nanosecond to about 1.0 nanosecond for SRAM, about 5.0 nanoseconds to about 20 nanoseconds for DRAM, about 500,000 nanoseconds to about 1 million-nanoseconds for NROM, and greater than about 10 million nanoseconds for NAND.

The present disclosure includes memory that may include, for example, non-volatile memory cells in which an active element, such as a field-effect transistor, may be integrated with a (e.g., unique) set of dielectric stack, that can store a charge. In some examples, such a memory might be referred to as silicon-based-unified memory (SUM), such as USUM. In some examples, the design of the dielectric stack may be varied so that the non-volatile memory cell (e.g., a USUM memory cell) may operate as an L1-, L2-, L3-, L4-, or L5-level memory cell. For example, the memory cells disclosed herein may belong to the class of FET-based USUM family of non-volatile memory cells and may be considered for applicability in functionality requirements, especially for L3, L4 and L5 functionality requirements while exhibiting higher performance, lower power consumption, and higher reliability than, with significantly higher storage capacity for example, than some conventional non-volatile memory cells.

In some examples, field-effect-transistor- (e.g., FET-) based USUM devices may be designed to achieve different functionality, dependent on intrinsic dielectric stack characteristics of a design, by adding or subtracting dielectrics in the dielectric stack. USUM technology may be integrated with the CMOS logic technology, for example, unlike conventional memories, such as DRAM, that may have unique customized integration requirements. USUMs may be differentiated by the attributes of their charge transport, charge storage, and charge retention (e.g., charge blocking) characteristics. For example, the intrinsic memory-cell attributes may be different in terms of programming speed, power, and refresh requirements that may result in cycle-time variations, variations in data throughput and system capability, and differing applicability to replace conventional memories by functionality.

In some examples, some USUMs may have a programming voltage of about 5.0 volts to about 7.5 volts (e.g., compared to about 12 volts or higher for some NROMs and NANDs) and a programming speed of less than about 100 microseconds for two bits per memory cell (e.g., compared to about 1.0 millisecond for one bit per cell for some NROMs). Some USUMs may have an energy consumption of about 50 times less than some NROMs, for example.

Some DRAMs may operate at 1.5 volts and may need to be refreshed about every 10 milliseconds, for example. However, some USUMs, for example, may need to be reprogrammed every 10 seconds. Some DRAM memory cells, for example, may require twice as much area as some USUMs In various examples, SUM-memory-cell fabrication is compatible with complementary-metal-oxide-semiconductor (CMOS) fabrication techniques. This may allow, for example, the dielectric stack to be fabricated to a desired memory level (L1, L2, L3, L4, or L5) with a minimal number of additional processing steps. Moreover, the SUM memory cells may be scalable to about a five-nanometer feature size. For example, such scaling may be difficult for conventional DRAM designs.

USUM memory cells may be implemented (e.g., in scaled silicon) using, for example, CMOS logic technology and a set of unified and complimentary integration schemes that may eliminate some separate, custom-integration technology practices, such as those currently employed for DRAM (e.g., for L3), and NROM (for code, BIOS, etc.) and NAND-Flash ((e.g., for L4) memory chips. USUM memory cell technology may (e.g., only) add or subtract specific selected dielectrics (e.g., as thin films) in the gate stack design in a unified process integration methodology with the scaled CMOS logic technology to enable functionality equivalence from L1 through L5. This may potentially have, for example, multiple benefits, such as a) technology compatibility, b) productivity, c) enhancement in technology reliability, and d) reduction (e.g., elimination) of interfacing technology and packaging between different memory types and between logic and memories. For example, potential benefits at the system level may include not only process complexity reduction, but also, cost reduction, power reduction, and enhancements in performance, and reliability.

Multiple and wide-ranging memory cell performance and associated data throughput from the memory array may be built into the same USUM cell design. For example, this may be achieved by integrating dielectrics with well-defined intrinsic attributes into the dielectric stack design of an USUM memory cell while using a similar (e.g., the same) technology integration scheme. This may provide, for example, certain functionality and memory capability within a single memory array design that may not be feasible for conventional memories.

USUMs, for example, may allow for similar memory cell designs and array architectures throughout the memory hierarchy that may provide a spectrum of cycle time, latency targets, and data throughput to deliver varying functionality requirements that might be balanced for certain applications. Due to the process commonality, USUM-cell designs might be implemented in different capacity arrays and or subarrays within a single chip or multiple chips to address system cost, power, form-factor, performance, durability, packaging, and testing objectives. This may provide more flexibility in system design, for example.

Some USUM memory cell designs, for example, may employ an energy-efficient direct tunneling mechanism to achieve desired system performance and functionality. For example, this approach may allow voltage scalability for programming memory cells, and, consequently, power savings, that may be difficult to achieve using conventional memories and hierarchical memory designs of comparable performance and applicability.

Band-engineered USUM memory cells, for example, may employ stack design and tailored programming to establish targeted speed-retention tradeoffs towards achieving the system data-rate throughput (L1/L2/L3/L4 functionality) for effective execution of functions. For example, this approach may reduce data transmission delays, and thus increase data availability, at appropriate processing nodes, reduce prefetch data storage requirements, reduce machine cycle time for execution of functions, reduce data refresh requirements, reduce complexity in bus design, reduce packaging and testing requirements etc.

USUM-memory-cell designs may provide, for example, unique sets of functional attributes via dielectric stack designs for FET based charge-trap memory cells. For example, the USUM memory cell and array design may Have the potential to create superior digital systems.

To be consistent with the examples in FIGS. 3A, 3B and 4 discussed below, the y-direction in the following discussions of the examples in FIGS. 2A-2C may correspond to the lateral direction in FIGS. 3A, 3B, and 4, and the z-direction in FIGS. 2A-2C may correspond to the vertical direction in FIGS. 3A, 3B, and 4. Therefore, the stacks in the y-direction in FIGS. 2A-2C may be lateral stacks in FIGS. 3A, 3B, and 4. In the discussions, FIGS. 2A-2C when an element is over another element it may be over in the y-direction (e.g., the lateral direction), for example. The dielectric stacks described below in conjunction with FIGS. 2B and 2C may be used for the dielectric stacks described below in the examples of FIGS. 3A, 3B, and 4.

Figure 2A:
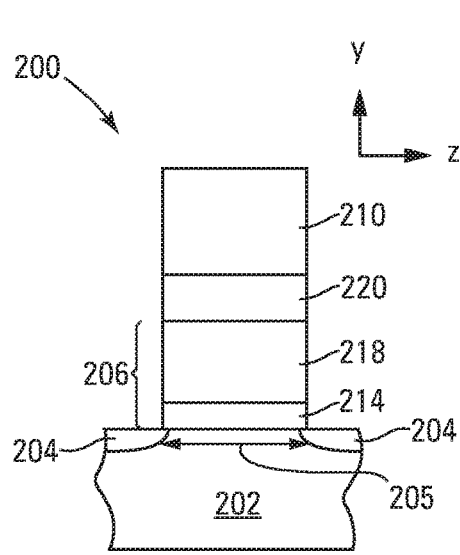
FIG. 2A illustrates an example of a transistor in accordance with a number of embodiments of the present disclosure.

FIG. 2A illustrates an example of a transistor 200, such as a field-effect transistor, that may be a logic transistor, for example, in accordance with a number of embodiments of the present disclosure. Transistor 200 may be adjacent to (e.g., over) a semiconductor 202, such as single crystal p⁻ silicon. Source/drains 204 (e.g., n⁺-type diffusion regions) may be in semiconductor 202. Transistor 200 may include a dielectric stack 206 as gate dielectric stack for the scaled FET device design adjacent to semiconductor 202 and source/drains 204. A channel 205 may be formed between source/drains 204 during operation of transistor 200, for example.

In some examples, dielectric stack 206 may include an interface dielectric 214 (e.g., of oxygen-rich silicon oxynitride (OR-SiON) having a dielectric constant (K) of about 5.0) adjacent to semiconductor 202 and source/drains 204. Interface dielectric 214 may act as a silicon-interface dielectric, such as a gate dielectric, of transistor 200, for example. A high-K blocking dielectric 218 (e.g., of hafnium silicon oxynitride (HfSiON) having a K of about 14) of dielectric stack 206 may be adjacent to gate dielectric 214. An interface metallic 220, such as a gate-interface metallic, (e.g., tantalum nitride (TaN)) may be adjacent to blocking dielectric 218, and thus dielectric stack 206. Note, for example, that control gate 210 may be adjacent to interface metallic 220, and interface metallic 220 may act as a barrier between control gate 210 and blocking dielectric 218. Metallic interface 214 is discussed below. Control gate 210 may, for example, be metal (e.g., tungsten, aluminum, etc.), or polysilicon (e.g., doped polysilicon, such as n⁺- doped polysilicon), etc.

In some examples, interface metallic 220 may act to create, at least in part, the threshold of transistor 200 by controlling the metal-insulator work function of the gate stacks for both the access gate as well as the control gate of the memory cell. In an example, the dielectric 214 might be about 1.0 nanometer to about 1.5 nanometers thick, and the blocking dielectric 218 might be about 6.0 nanometers thick.

The effective oxide thickness (EOT) for the scaled FET device may be designed to be less than about 2 nanometers. The EOT, for example, may be the thickness that silicon dioxide (SiO$_2$) would need to be to have the capacitance of a material or stack of materials. Dielectric layers 214 and 218, metallic interface 220, and control gate 210 of the FET stack design may common layers for the non-volatile memory stacks to be described in the examples of FIGS. 2B and 2C. This commonality and related integration scheme, for example, may be (e.g., essential) characteristics for the USUM technology.

Figure 2B:
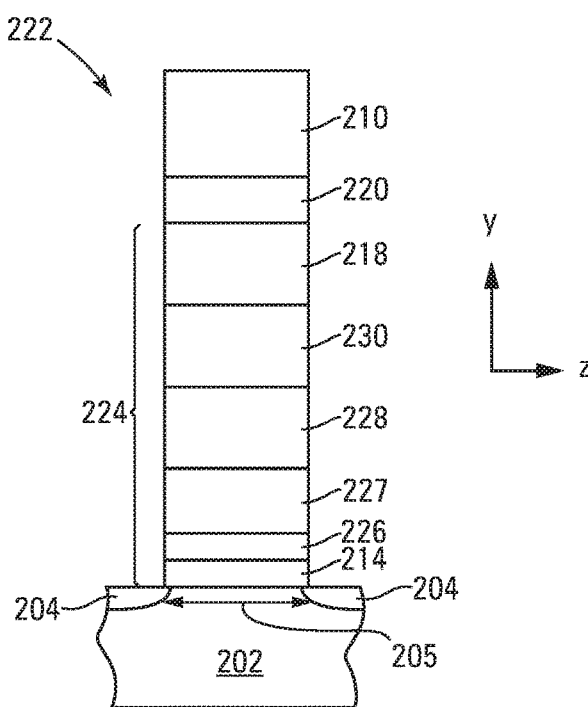
FIG. 2B illustrates an example of a non-volatile memory cell in accordance with a number of embodiments of the present disclosure.

FIG. 2B illustrates an example of a non-volatile memory cell 222 in accordance with a number of embodiments of the present disclosure. For example, FIG. 2B illustrates an example of a gate stack structure of non-volatile memory cell 222 in accordance with a number of embodiments of the present disclosure. In the example of FIG. 2B, additional dielectrics may be added to the dielectric stack 206 of transistor 200 to form a non-volatile dielectric stack 224 of memory cell 222 to store a charge. In some examples, memory cell 222 may be an L2-L3-level memory cell, such as an L2-L3-level USUM cell (e.g., that may replace an SRAM- or DRAM volatile memory cell). For example, memory cell 222 may function both as a L2 level memory cell as in a separate array or sub-array as well as an L3-level memory cell in another sub-array or may be in a main memory array of an electronic system. Table 1 provides an example of a dielectric stack 224 for an L2-L3-level memory cell.

TABLE 1

Example of a dielectric stack 224 (FIG. 2B) for an L3-Level Memory Cell

| Interface Dielectric 214 | Storage Dielectric 226 | Tunnel Dielectric 227 | Charge Trap 228 | Storage Dielectric 230 | Blocking Dielectric 218 |
|---|---|---|---|---|---|
| OR-SiON 1-1.5 nm | i-SRN 1 nm | HfSiON 2 nm | GaN 5 nm | i-SRN 5 nm | HfSiON 6 nm |

Dielectric stack 224 may include, for example, the interface dielectric 214 that may act as an interface tunnel dielectric of memory cell 222 and may be as described above in conjunction with transistor 200 in FIG. 2A. A (e.g., an ultra-thin) storage dielectric 226 (e.g., silicon-rich nitride (SRN) that may contain silicon nano-particles in nitride) may be adjacent to interface dielectric 214 in dielectric stack 224. For example, storage dielectric 226 might be about 1.0 nanometer thick and, for example, may have silicon nano-particles (e.g., with a diameter of about 1.0 nanometer) in nitride. Storage dielectric 226, for example, might be referred to as an injector dielectric (e.g., an injector-silicon-rich nitride (i-SRN)). For example, the storage dielectric 226 may act as an internal "electro-static-potential-modulator." Storage dielectric layer 226 may act, for example, to reduce reverse tunneling through internally generated repulsive field for charges stored in the charge trap 228 and the storage dielectric 230, discussed below (e.g., during a standby state of the memory), and thereby may extend the refresh time for the L2-L3 functionality. In some examples, storage dielectric 226 may store some charge and may act as a barrier to reduce charge leakage from memory cell 222.

A tunnel dielectric 227, such as HfSiON, may be adjacent to storage dielectric 226 in dielectric stack 224. For example, tunnel dielectric 227 might be about 2.0 nanometers thick for memory cell 222 (e.g., an L2-L3-level memory cell). The charge trap 228, such as gallium nitride (GaN) having a K of about 10, may be adjacent to tunnel dielectric 227 and, for example, may have a thickness of about 5.0 nanometers.

The storage dielectric 230 (e.g., i-SRN) may be adjacent to charge trap 228 in dielectric stack 224. For example, storage dielectric 230 might be about 5.0 nanometers thick. The blocking dielectric 218, as described above in conjunction with transistor 200 in FIG. 2A, may be adjacent to storage dielectric 230 in dielectric stack 224. The interface metallic 220, as described above in conjunction with transistor 200 in FIG. 2A, may be adjacent to blocking dielectric 218, and thus dielectric stack 224. The control gate 210, as described above in conjunction with transistor 200 in FIG. 2A, may be adjacent to interface metallic 220.

In some examples, interface dielectric 214 may be in direct physical contact with semiconductor 202, storage dielectric 226 in direct physical contact with interface dielectric 214, tunnel dielectric 227 in direct physical contact with storage dielectric 226, charge trap 228 in direct physical contact with tunnel dielectric 227, storage dielectric 230 in direct physical contact with charge trap 228, blocking dielectric 218 in direct physical contact with storage dielectric 230, interface metallic 220 in direct physical contact with blocking dielectric 218, and control gate 210 in direct physical contact with interface metallic 220.

In some examples, such as the example of Table 1, the effective oxide thickness (EOT) of dielectric stack 224 might be about 6.0 nanometers, where the EOT is the thickness that silicon dioxide (SiO$_2$) would need to be to have the capacitance of a material or stack of materials. For example, a dielectric stack 224 having an EOT of about 6.0 nanometers means that the capacitance of dielectric stack 224 is the capacitance of about 6.0 nanometers of SiO$_2$. The EOT of the combined tunnel dielectrics 214 and 227 (e.g., tunnel EOT), such as for the example of Table 1, may be less than about 2.0 nanometers.

The program/erase time for a memory cell 222 (e.g., having the dielectric stack 224 in the example of Table 1) might be about 30 nanoseconds to about 50 nanoseconds (e.g., in the range of some DRAMs) for a program/erase voltage of about ±4.0 V, for example. For some examples, such as for the example of Table 1, the initial memory window of memory cell 222 might be about 2.0 V, and the end-of-life memory window might be greater than about 1.0 V. The end-of-life endurance of memory cell 222, for some examples, such as the example of Table 1, may be greater than about 10 billion write/erase cycles, compared to about a million write/erase cycles for conventional non-volatile memory cells. The retention of memory cell 222, for some examples, such as the example of Table 1, may be on the order of hours (e.g., considerably longer than conventional DRAM that may need to be refreshed about every 10 milliseconds). The peak write/erase field (e.g., a measure of the charge transport energy) of memory cell 222, for some examples, such as the example of Table 1, may be less than about 7.5 megavolts/centimeter, compared with about 12.0 megavolts/centimeter to about 15.0 megavolts/centimeter for conventional nonvolatile memory cells.

Note that non-volatile memory cell 222 may be created from the basic transistor 200 by adding additional dielectric layers, such as storage dielectric 226, tunnel dielectric 227, charge trap 228, and storage dielectric 230 to the dielectric stack 206 of transistor 200 to create the dielectric stack 224 of memory cell 222. Note further, for example, that incorporating such additional dielectric layers provide a means of required carrier transport and charge storage within the gate dielectric stack to provide L2-L3 functionality for the memory cell 222. Therefore, for example, non-volatile memory cell 222 may be considered to be unified with the FET based transistor technology which provides the transistor 200 (e.g., FET based technology).

As indicated above, memory cell 222 may be an L2-L3-level non-volatile memory cell. However, the dielectric stack 224 of memory cell 222 may be adjusted so that memory cell 222 may become an L3-L4-level non-volatile memory cell, such as an L3-L4-level USUM cell, that may replace conventional NAND non-volatile memory cells and/or conventional NROM non-volatile memory cells. For example, memory cell 222 may function as an L4-level memory cell and may be in a storage memory of an electronic system. Increasing the thickness of tunnel dielectric 227 from about 2.0 nanometers (e.g., L2-L3-level cell) to about 3.0 to 4.0 nanometers, for example, while leaving the remaining dielectrics of dielectric stack 224 as described above (e.g., as shown in the example of Table 2) may cause memory cell 222 to function as an L4-level memory cell.

TABLE 2

Example of a dielectric stack 224 (FIG. 2B) for an L4-Level Memory Cell

| Interface Dielectric 214 | Storage Dielectric 226 | Tunnel Dielectric 227 | Charge Trap 228 | Storage Dielectric 230 | Blocking Dielectric 218 |
|---|---|---|---|---|---|
| OR-SiON 1-1.5 nm | i-SRN 1 nm | HfSiON 3-4 nm | GaN 5 nm | i-SRN 5 nm | HfSiON 6 nm |

In some examples, such as the example of Table 2, the EOT of the dielectric stack of the resulting L3-L4-level non-volatile memory cell may be about 7.0 nanometers; the EOT of the combined tunnel dielectrics 214 and 227 may be less than about 2.5 nanometers; and the program/erase time of the resulting L3-L4-level non-volatile memory cell might be about 1.0 microsecond for a program/erase voltage of about ±5.0 V. Moreover, the resulting L3-L4-level non-volatile memory cell, for some examples, such as the example of Table 2, may have an end-of-life endurance of about greater than 10 billion write/erases, a retention on the order of days or months, and a peak write/erase field less than about 7.5 megavolts/centimeter. The initial memory window of the resulting L4-level non-volatile memory cell might be greater than about 3.0 V, and the end-of-life memory window might be greater than about 1.5 V, for some examples, such as the example of Table 2. Note that increasing the thickness of tunnel dielectric 227 in memory cell 222 (e.g., from that in Table 1 to that in Table 2) may act to increase the retention and memory window at the expense of speed (e.g., program/erase time) to create an L4-level cell from an L3-level cell.

Figure 2C:
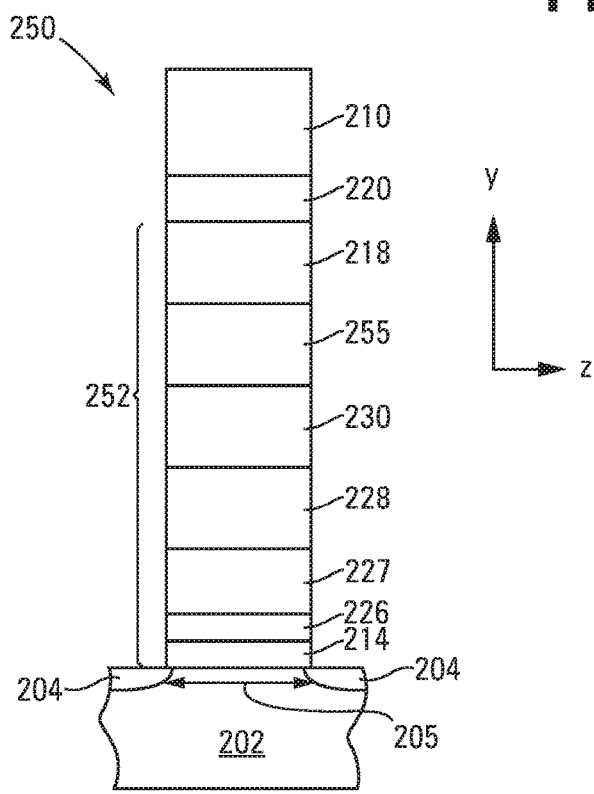
FIG. 2C illustrates another example of a non-volatile memory cell in accordance with a number of embodiments of the present disclosure.

FIG. 2C illustrates an example of a non-volatile memory cell 250 in accordance with a number of embodiments of the present disclosure. In the example of FIG. 2C, additional dielectrics are added to the dielectric stack 206 of transistor 200 to form a non-volatile dielectric stack 252 of memory cell 250 to store a charge. In some examples, memory cell 250 may be an L4-L5-level memory cell, such as an L4-L5-level USUM cell, that may be in a memory that may replace HDD. For example, Table 3 illustrates an example of a dielectric stack 252 for an L4-L5-level memory cell. For example, increasing the thickness of tunnel dielectric 227 from its thickness in either the L3-level cell (e.g., in Table 1) or the L-4 level cell in (e.g., in Table 2) and adding a blocking dielectric (e.g., of aluminum oxide ($Al_2O_3$)) to the dielectric stacks of either the L3-level cell or the L-4 level cell may act to produce memory cell 250.

TABLE 3

Example of a dielectric stack 252 (FIG. 2C) for an L4-L5-Level Memory Cell

| Interface Dielectric 214 | Storage Dielectric 226 | Tunnel Dielectric 227 | Charge Trap 228 | Storage Dielectric 230 | Blocking Dielectric 255 | Blocking Dielectric 218 |
|---|---|---|---|---|---|---|
| OR-SiON 1-1.5 nm | i-SRN 1 nm | HfSiON 6-8 nm | GaN 5 nm | i-SRN 5 nm | $Al_2O_3$ 4 nm | HfSiON 6 nm |

Dielectric stack 252 may include, for example, interface dielectric 214 (e.g., as described above in conjunction with memory cell 222 in FIG. 2B) adjacent to semiconductor 202 and source/drains 204, storage dielectric 226 (e.g., as described above in conjunction with memory cell 222 in FIG. 2B) adjacent to interface dielectric 214, tunnel dielectric 227 (e.g., as described above in conjunction with memory cell 222 in FIG. 2B, except that tunnel dielectric 227 may be about 6.0 nanometers to about 8.0 nanometers thick) adjacent to storage dielectric 226, charge trap 228 (e.g., as described above in conjunction with memory cell 222 in FIG. 2B) adjacent to tunnel dielectric 227, and storage dielectric 230 (e.g., as described above in conjunction with memory cell 222 in FIG. 2B) adjacent to charge trap 228.

A blocking dielectric 255 may be adjacent to storage dielectric 230 in dielectric stack 252, for example. In some examples, blocking dielectric 255 may be aluminum oxide ($Al_2O_3$) having a K of about 10 and, for example, a thickness of about 4.0 nanometers. The blocking dielectric 218 may be adjacent to blocking dielectric 255 in dielectric stack 252. The interface metallic 220 may be adjacent to blocking dielectric 218, and thus dielectric stack 252. The control gate 210 may be adjacent to interface metallic 220. In some examples, the blocking dielectric 255 (e.g., the $Al_2O_3$) may interact with the adjacent storage dielectric 230 (e.g., the i-SRN) to provide high-density fixed (e.g., to within routine variations) negative charge at the blocking dielectric 255/storage dielectric 230 (e.g., at the $Al_2O_3$/i-SRN) interface.

In some examples, interface dielectric 214 may be in direct physical contact with semiconductor 202, storage dielectric 226 in direct physical contact with interface dielectric 214, tunnel dielectric 227 in direct physical contact with storage dielectric 226, charge trap 228 in direct physical contact with tunnel dielectric 227, storage dielectric 230 in direct physical contact with charge trap 228, blocking dielectric 255 in direct physical contact with storage dielectric 230, blocking dielectric 218 in direct physical contact with blocking dielectric 255, interface metallic 220 in direct physical contact with blocking dielectric 218, and control gate 210 in direct physical contact with interface metallic 220.

In some examples, such as the example of Table 3, the EOT of dielectric stack 252 may be about 9.0 nanometers; the EOT of the combined tunnel dielectrics 214 and 227 may be about 3.3 nanometers; and the program/erase time of memory cell 250 might be about 1.0 millisecond for a program/erase voltage of about ±7.5 V. Moreover, memory cell 250, for some examples, such as the example of Table 3, may have an end-of-life endurance of about greater than 10 billion write/erases, a retention greater than about 10 years, and a peak write/erase field less than about 7.8 megavolts/centimeter. The initial memory window of memory cell 250, for some examples, such as the example of Table 3, might be greater than about 6.0 V, and the end-of-life memory window might be greater than about 4.0 V, for example. Note, for example, that increasing the thickness of tunnel dielectric 227 in memory cell 222 (e.g., from that in Table 1 or that in Table 2 to that in Table 3) and adding dielectric 255 may act to increase the retention and memory window at the expense of speed (e.g., program/erase time) to create an L5-level cell from either an L3- or L4-level cell. The increased retention and memory window, for example, may be due to reduced charge loss to the control gate that may result from the relatively high energy barrier of dielectric 255 (e.g., of $Al_2O_3$) combined with the fixed negative charge at the blocking dielectric 255/storage dielectric 230 (e.g., at the $Al_2O_3$/i-SRN) interface.

Non-volatile memory cell 250 may be created from the basic transistor 200 by adding storage dielectric 226, tunnel dielectric 227, charge trap 228, storage dielectric 230, and blocking dielectric 255 to the dielectric stack 206 of transistor 200 to create the dielectric stack 252 of transistor 250. For example, non-volatile memory cell 250 may be said to be transistor based. Note that the dielectric stacks discussed above in conjunction with FIGS. 2A-2C (e.g., dielectric stacks 206, 224, and 252) may be formed by a single machine (e.g., a single low-pressure-chemical-vapor-deposition (CVD) system) that can ease integration and reduce fabrication cost.

Note that interface dielectric 214, storage dielectric 226, tunnel dielectric 227, charge trap 228, storage dielectric 230, blocking dielectric 218, and interface metallic 220 may be common to the dielectric stacks of the L3- and L4-level memory cells (e.g., dielectric stack 224) and the L5-level memory cell (e.g., dielectric stack 252), discussed above. In some examples, an integration scheme may be adopted that would appropriately define the L3-, L4-, and L5-level non-volatile memory array regions.

Interface dielectric 214, storage dielectric 226, and tunnel dielectric 227 may then be formed in the L3-, L4-, and L5-level memory array regions. Subsequently, the L3-level memory array region may be protected while an additional thickness of tunnel dielectric 227 is formed in the defined L4- and L5-level memory array regions. The process may be repeated by protecting the L3- and L4-level memory array regions while an additional thickness of tunnel dielectric 227 is formed in the L5-level memory array region. Charge trap 228 may then be formed in the L3-, L4-, and L5-level memory array regions (e.g., over tunnel dielectric 227). Storage dielectric 230 may then be formed in the L3-, L4-, and L5-level memory array regions (e.g., over charge trap 228). Then, the L3- and L4-level memory array regions may be protected while forming blocking dielectric 255 in the L5-level memory array region (e.g., over storage dielectric 230). Then, blocking dielectric 218 and interface metallic 220 may be formed in the L3-, L4-, and L5-level memory array regions and any FET regions.

In some examples, the relatively low peak write/erase fields of the dielectric stacks of the memory cells discussed above in conjunction with FIGS. 2B and 2C (e.g., less than about 7.8 megavolts/centimeter compared with about 12.0 megavolts/centimeter for conventional nonvolatile memory cells) may result in the relatively large end-of-life endurance for the memory cells discussed above (e.g., about greater than 10 billion write/erases, compared to about a million write/erases for conventional non-volatile memory cells). Consequently, programming energy requirements may be reduced by a factor of greater than about two.

The examples of the dielectric stacks of the memory cells discussed above in conjunction with FIGS. 2B and 2C may include a double-tunnel structure (e.g., interface dielectric 214 and tunnel dielectric 227) that may act to enhance the programming speed at a reduced programming voltage (e.g., about 30 nanoseconds to about 50 nanoseconds for a program/erase voltage of about ±4.0 V for the L3-level memory cell, about 1.0 microsecond for a program/erase voltage of about ±5.0 V for the L4-level cell, and about 1.0 millisecond for a program/erase voltage of about ±7.5 V for the L5-level cell).

In some examples, the charge trap 228 (e.g., GaN) in the dielectric stacks of the memory cells discussed above in conjunction with FIGS. 2B and 2C may have a relatively large band offset (e.g., FIG. 2D) and may combine with storage dielectrics 226 and 230 (e.g., i-SRN) of those gate stacks to provide (e.g., simultaneously) the relatively large memory windows and the relatively long retentions (e.g., as discussed above in conjunction with FIGS. 2B and 2C). The tunnel EOTs discussed above in conjunction with FIGS. 2B and 2C may be adjusted, for example, to achieve trade-offs between retention and speed. For example, the retentions and program/erase times may be different for the different tunnel EOT's of the L3-, L4-, and L5-level memory cells discussed in conjunction with FIGS. 2B and 2C.

The blocking dielectric 218 and the interface metallic 220 (e.g., TaN) in the dielectric stacks discussed above in conjunction with FIGS. 2B and 2C may act, for example, to reduce undesirable charge injection from control gate 210. In some examples, the high-K dielectrics, such as HfSiON with a breakdown strength of about 20 megavolts/centimeter and low intrinsic charge trapping characteristic, may act to enhance device reliability.

Figure 2D:
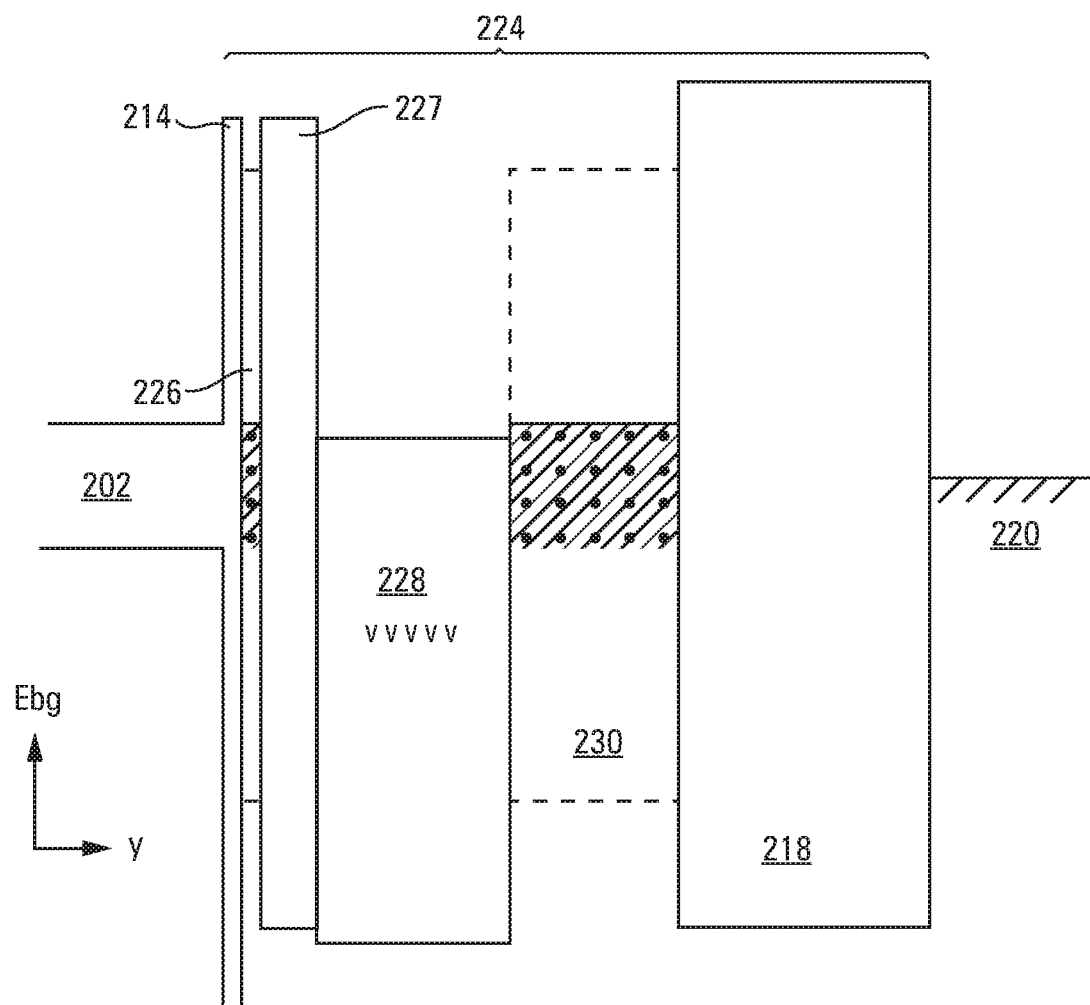
FIG. 2D is an example of a band-offset diagram of a dielectric stack in accordance with a number of embodiments of the present disclosure.

FIG. 2D is an example of a band-gap-energy- (Ebg) offset diagram of a dielectric stack, such as dielectric stack 224 in the examples of FIG. 2B, Table 1, and Table 2 in accordance with a number of embodiments of the present disclosure. For example, FIG. 2D may show Ebg as a function of the distance in the y-direction from semiconductor 202, e.g., in the absence of a voltage differential being applied across the memory cell with dielectric stack 224. The reference numbers in FIG. 2D correspond to the reference numbers that identify the dielectrics in FIG. 2B. For example, in FIG. 2D (as in FIG. 2B), interface dielectric 214 (e.g., OR-SiON) is adjacent to semiconductor 202 (e.g., P⁻ silicon substrate); storage dielectric 226 (e.g., i-SRN) is adjacent to interface dielectric 214; tunnel dielectric 227 (e.g., HfSiON) is adjacent to storage dielectric 226, charge trap 228 (e.g., GaN) is adjacent to storage dielectric 226; storage dielectric 230 (e.g., i-SRN) is adjacent to charge trap 228; blocking dielectric 218 is adjacent to storage dielectric 230; and interface metallic 220 is adjacent to blocking dielectric 218. In some examples, the combination of interface dielectric 214, storage dielectric 226, and tunnel dielectric 227 forms what may be called a "Modified Double Tunnel Junction" (MDTJ) 258.

In FIG. 2D, the bottom boundary of a respective band may, for example, represent the valence energy of the material of the respective band, and the top boundary of a respective band may, for example, represent the conduction energy of the material of the respective band. For example, a respective band represents the energy difference (e.g., band-gap energy Ebg) between the conduction energy and the valence energy.

Figure 2E:
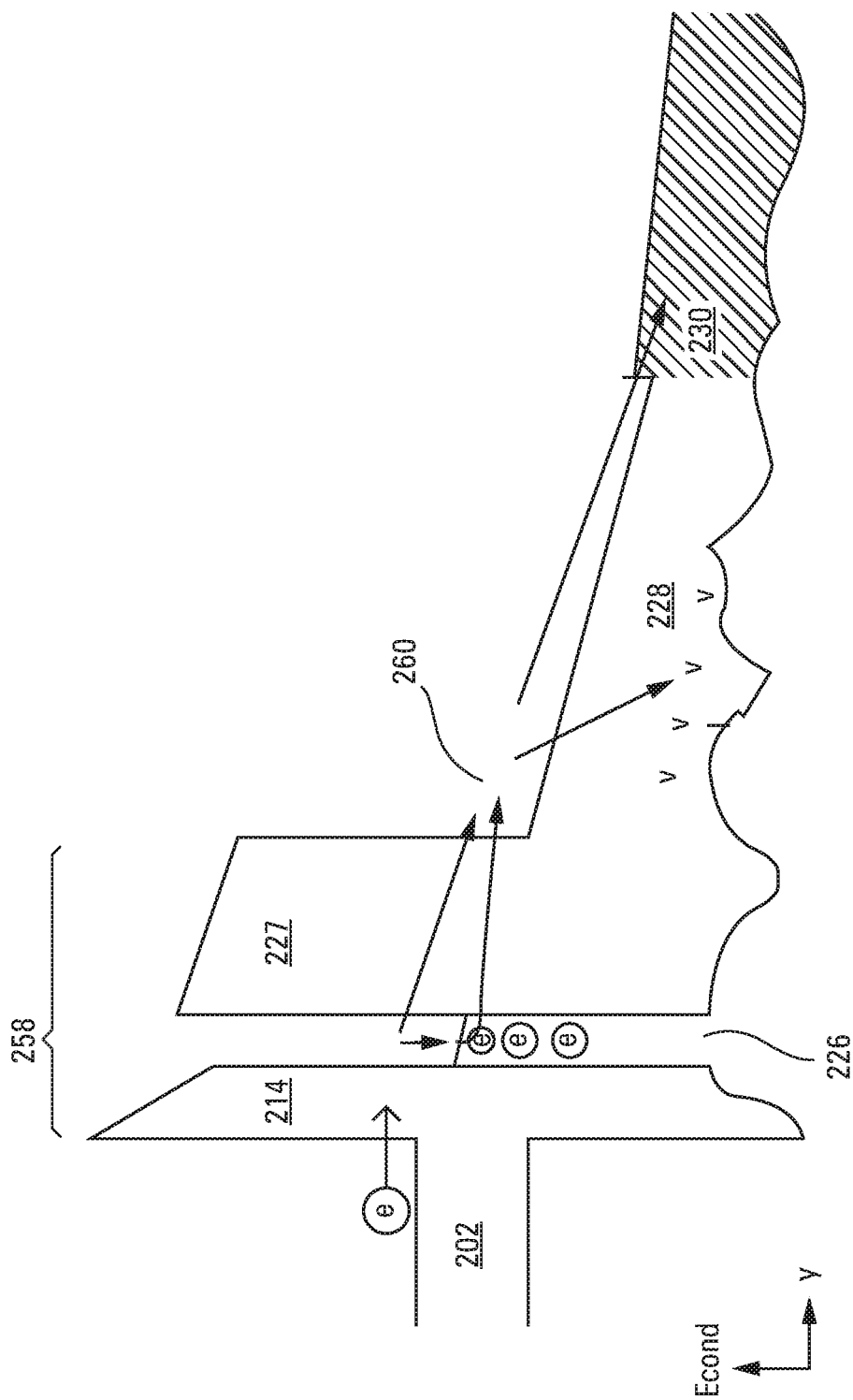
FIG. 2E is an example of a conduction band diagram of a portion of a dielectric stack during programming in accordance with a number of embodiments of the present disclosure.

FIG. 2E is an example of a conduction-energy—(e.g., Econd) band diagram of a portion of a dielectric stack, such as dielectric stack 224 in the examples of FIG. 2B, Table 1, and Table 2, showing charge transport during programming, for example, in accordance with a number of embodiments of the present disclosure. The reference numbers in FIG. 2E correspond to the reference numbers that identify the components in FIG. 2B. For example, in FIG. 2E (as in FIG. 2B), interface dielectric 214 (e.g., OR-SiON) is adjacent to semiconductor 202; storage dielectric 226 (e.g., i-SRN) is adjacent to interface dielectric 214; tunnel dielectric 227 (e.g., HfSiON) is adjacent to storage dielectric 226, and charge trap 228 (e.g., GaN) is adjacent to tunnel dielectric 227. Note, for example, the double tunneling denoted by reference number 260.

For example, FIG. 2E may illustrate the conduction energies in response to an electrostatic field, resulting from a programming voltage being applied to control gate 210 of FIGS. 2A, 2B, and 2C (e.g., while semiconductor 202 may be grounded). For example, FIG. 2E may be in response to a programming-voltage differential across a memory cell (e.g., the difference between the voltage applied to control gate 210 and a voltage applied to semiconductor 202 (e.g., to a channel 205 between the source/drains 204 in FIGS. 2B and 2C). For example, FIG. 2E shows the conduction energy Econd as a function of the distance in the y-direction from semiconductor 202, for example.

FIG. 2E illustrates, for example, how a voltage applied to the memory cell may be divided up in the successive dielectrics of a dielectric stack and the associated electrostatic field suggested by the slope of the conduction band, for example, to be experienced by an electron at the onset of the voltage imposed on the control gate. This may be called "Band-Bending." The greater (e.g., steeper) the band-bending, the faster the electron may move. For example, the electrons may acquire energy from the electric field and may be accelerated (field-enhancement). For example, faster movement of the electrons and subsequent trapping thereof may result in faster device performance and shorter cycle times for the memory.

Charges (e.g., electrons) from semiconductor 202 may not have enough energy to surmount the relatively high conduction energy (e.g., about 3.0 electron volts) barrier of interface dielectric 214. For example, the electrostatic field may not be strong enough to bring the charges to the conduction energy of interface dielectric 214. However, the thickness of interface dielectric 214 (e.g., about 1.0 nanometer to about 1.5 nanometers) may be sufficiently small to allow the charge from semiconductor 202 to tunnel directly through interface dielectric 214 (e.g., to the nanocrystals of layer 226). For example, charge (e.g., electron) transport through interface dielectric 214 may be by direct tunneling (e.g., due to quantum mechanical effects). The interface dielectric 214 may be to pass charges from semiconductor 202 by direct tunneling.

In some examples, some (e.g., at least a portion of the) charges from interface dielectric 214 may be stored (e.g., held in the silicon nano-crystal induced potential well) in storage dielectric 226. For example, the charges may be held temporarily in storage dielectric 226. This may act, for example, to hold up some of the charge that passes through interface dielectric 214. Successively, the direct tunneling continues through the dielectric 227. The double layer direct tunneling with partial trapping/storing in storage dielectric 226 may be called "modified double tunneling" (MDT).

After the voltage differential across the memory cell is removed (e.g., after programming is completed), some of the charges may remain in storage dielectric 226 and may act to produce a repulsive electrostatic field due to partial trapping of electrons. Since both storage dielectric 226 and the combination of charge trap 228 and storage dielectric 230 may hold electronic charges, and since same polarity of charges may repel (e.g., oppose) each other, this may act to create a reverse electrostatic field that may act to reduce charge leakage toward semiconductor 202, for example. As a result, there may be an increase of the memory window and the retention of the memory cell and increased duration between refreshes. In this respect, for example, storage dielectric 226 may act as a barrier to charge transport toward semiconductor 202 (e.g., thereby increasing the refresh duration and retention).

Figure 3A:
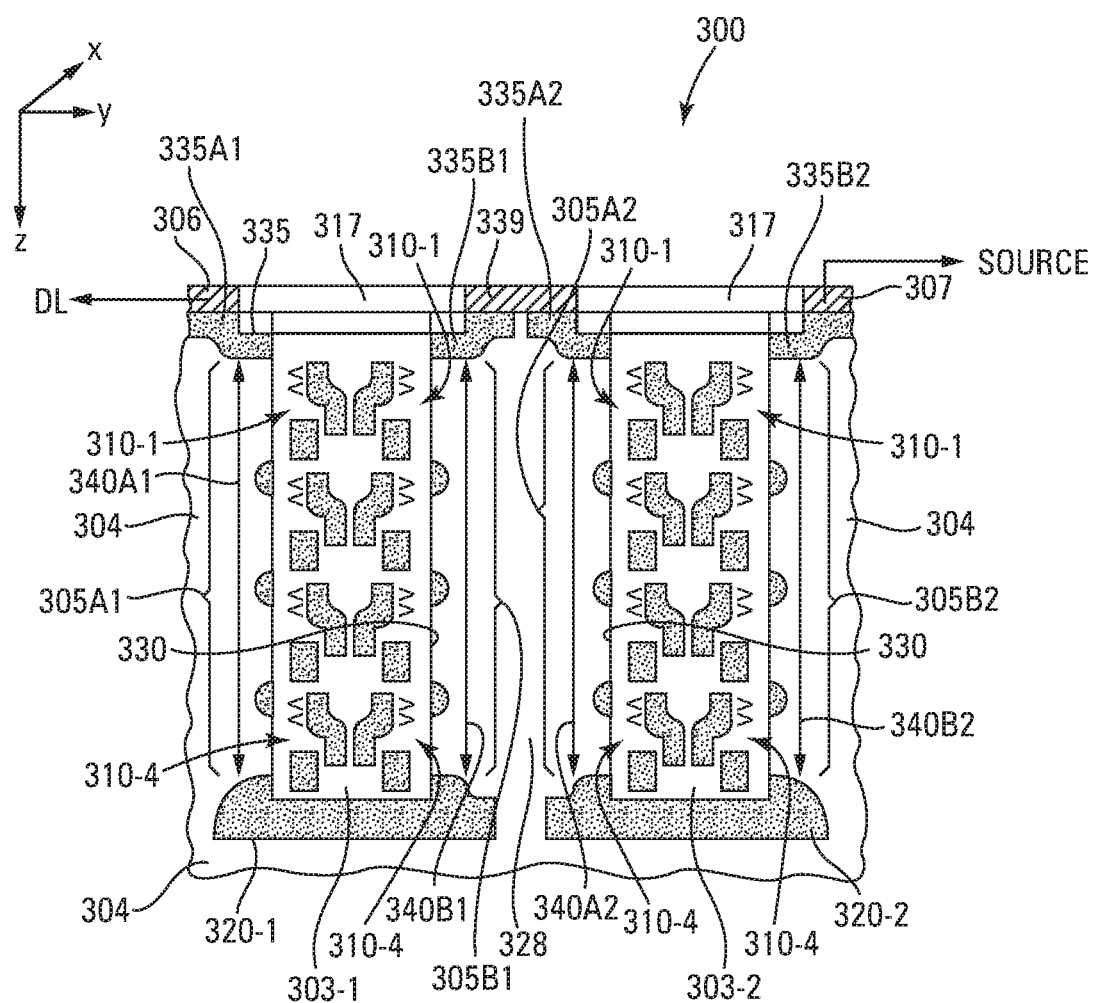
FIG. 3A is cross-sectional view of an example of a portion of a memory array in accordance with a number of embodiments of the present disclosure.

FIG. 3A is cross-sectional view of an example of a portion of a memory array 300 that may be included in a memory, such as a memory of electronic system 100 in accordance with a number of embodiments of the present disclosure. For example, memory array 300 may be included in any one of memories 120, 125, and 130 or a memory that may integrate functionalities of memories 120, 125, and 130. FIG. 3B is a cross-sectional view of a detailed example of a region (e.g., a trench) 303 (e.g., regions 303-1 and 303-2) of FIG. 3A in accordance with a number of embodiments of the present disclosure.

FIG. 3A is an example of a possible configuration of a group, such as a (e.g., NAND) string of series-coupled memory (e.g., vertical channel split-gate memory) cells between a data line DL and a source, where the string channel may be continuous in the vertical direction through interlinking conductive regions (e.g., similar to conductive regions 360, in FIG. 3B), such as diffusion pockets, that may form source/drains of individual split-gate memory cells. A channel length of an individual memory cell may be made long enough (e.g., in the vertical (e.g., the z-) direction) by appropriate selection of the depth of a region 303 (e.g., trench) in which a string containing the individual memory cell is formed, and thereby, any short-channel effect of the individual memory cell may, for example, possibly be overcome.

In some examples, each individual memory cell may be a dual-gate split-channel memory cell, similar to memory cell 500 discussed in conjunction with FIG. 5A, that may, for example, have a fixed-Vt access gate and a variable Vt memory control gate, mutually capacitively coupled, together for controlling the (e.g., vertical) channel of the memory cell.

The example of FIG. 3A illustrates a pair of groups, such as strings 305A1 and 305B1 (e.g., string segments), of series-coupled memory cells in a region 303-1 and a pair of groups, such as strings 305A2 and 305B2 (e.g., string segments), of series-coupled memory cells in a region 303-2. For example, conductive regions 335B1 and 335A2, such as surface diffusions (e.g., linking n+ diffusion nodes), interlinked by a contact 339 may couple a memory cell 310-1 in string 305B1 to memory cell 310-1 in string 305A2. Although the example of FIG. 3A represents two pairs of strings for illustration purposes, the number of pairs of strings may be extended in the y-direction using interlinked conductive regions, such as illustrated for interlinked conductive regions 335B1 and 335A2, between the pairs of strings.

FIG. 3A illustrates a string 305A1 and a string 305B1 of (e.g., four) memory cells in region 303-1 and a string 305A2 and a string 305B2 of (e.g., four) memory cells in region 303-2. For example, string 305A1, and thus the memory cells therein, may be a mirror image of string 305B1, and thus the memory cells therein, and may be coupled to string 305B1 by a conductive region 320-1 (e.g., a buried n+ diffusion) in a semiconductor 304, such as single crystal p⁻ silicon. String 305A2, and thus the memory cells therein, may be a mirror image of string 305B2, and thus the memory cells therein, and may be coupled to string 305B2 by a conductive region 320-2 (e.g., a buried n+ diffusion) in semiconductor 304. The memory cells in string 305A1 may be electrically isolated from the memory cells in string 305B1 by a dielectric, such as an oxide, and the memory cells in string 305A2 may be electrically isolated from the memory cells in string 305B2 by that dielectric.

In the example of FIG. 3A, starting from conductive region 335A1, a channel continues (e.g., downwards) through the interlinking conductive regions between the memory cells in string 305A1, through conductive region 320-1, (e.g., upward) through the interlinking conductive regions between the memory cells in string 305B1, through interconnected conductive regions 335B1 and 335A2, (e.g., downwards) through the interlinking conductive regions between the memory cells in string 305A2, through conductive region 320-2, and (e.g., upward) through the interlinking conductive regions between the memory cells in string 305B2 to conductive region 335B2.

The example of FIG. 3A illustrates two strings, and thus eight memory cells, in each of regions 303-1 and 303-2 for a total of 16 series-coupled memory cells. In some examples, the number of memory cells in each string 305 within each region 303 may be increased by increasing the depth of regions 303. In some examples, the number of strings in each of regions 303 may be increased in the y-direction, such as by using contacts (e.g., similar to contact 339) between the strings within each of regions 303. The number of regions, such as regions 303, between data line DL and the source may be extended in the y-direction using interlinked conductive regions, such as illustrated for the interlinked conductive regions 335B1 and 335A2, between the regions.

A region 303 may extend (e.g., vertically), such as in the z-direction, into semiconductor 304, such as below an upper (e.g., a topmost) surface of semiconductor 304. Strings 305A and 305B of series-coupled memory cells may be in a region 303, as shown in FIG. 3B.

In some examples, strings 305A1, 305B1, 305A2, and 305B2 may be portions of a string (e.g., a NAND string) of series-coupled memory cells coupled between a contact 306 and contact 307. For example, contact 306 may be coupled to the data line DL through a select transistor (not shown), and contact 307 may be coupled to the source through a select transistor (not shown). For example, strings 305A1, 305B1, 305A2, and 305B2 may be coupled in series between the data line DL and the source. Each of strings 305A and 305B (e.g., each of strings 305A1, 305B1, 305A2, and 305B2 may include series-coupled memory cells 310-1 to 310-4.

Semiconductor 304 might be a base structure, for example, and its upper surface might be a base surface (e.g., of an integrated circuit die that might include memory array 300). The vertical (e.g., the z-) direction may be perpendicular to the base surface, for example. It will be appreciated that the terms vertical and vertical direction are used to denote directions perpendicular to a base surface and are intended to cover any direction perpendicular to a base surface (e.g., depending on the orientation of the base surface).

It should be recognized the term vertical accounts for variations from "exactly" vertical due to routine manufacturing, measuring, and/or assembly variations and that one of ordinary skill in the art would know what is meant by the term vertical. It should be recognized the term horizontal accounts for variations from "exactly" horizontal due to routine manufacturing, measuring, and/or assembly variations and that one of ordinary skill in the art would know what is meant by the term horizontal. It should be recognized the terms perpendicular and parallel respectively account for variations from "exactly" perpendicular and "exactly" parallel due to routine manufacturing, measuring, and/or assembly variations and that one of ordinary skill in the art would know what is meant by the terms perpendicular and parallel.

Figure 3B:
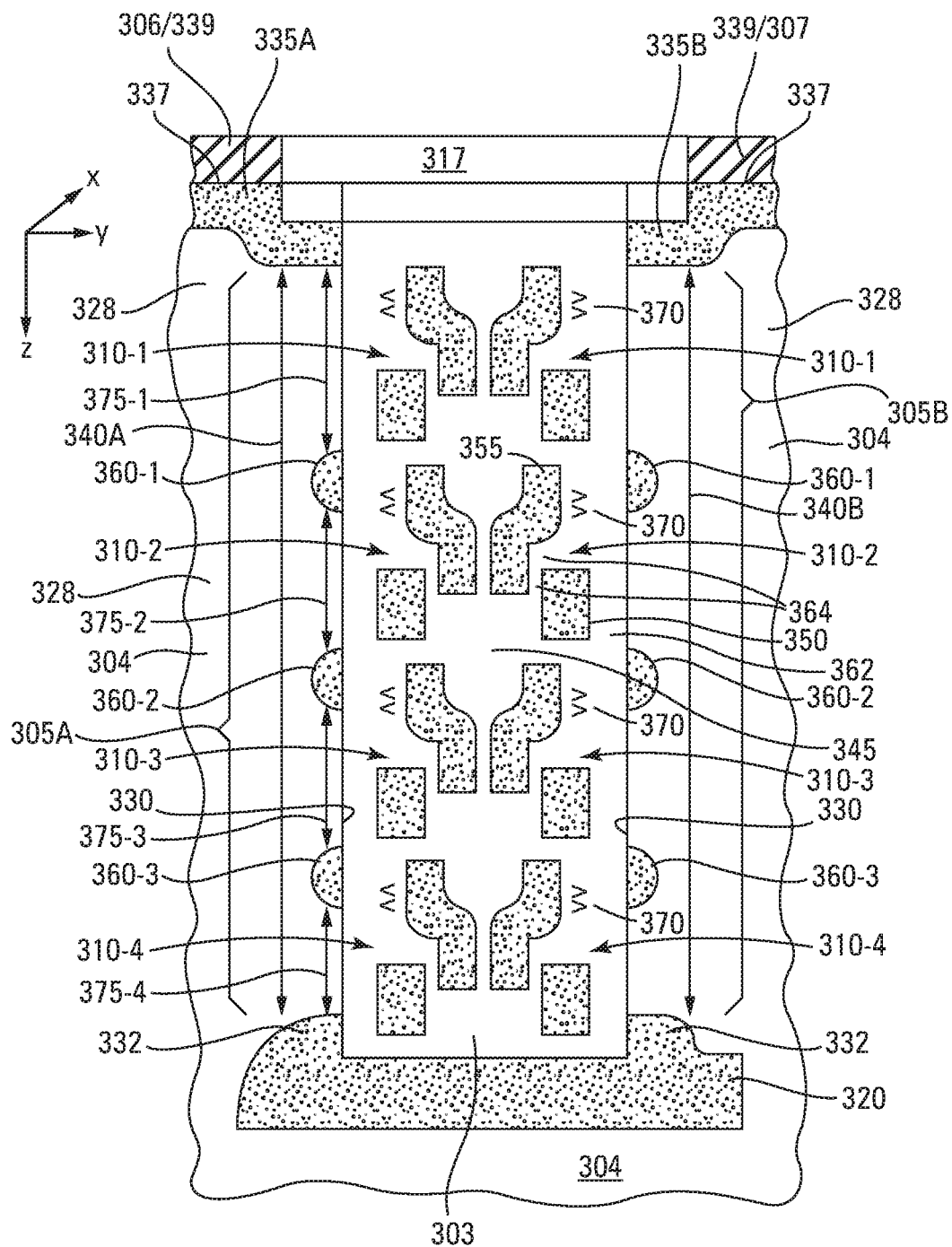
FIG. 3B is cross-sectional view of an example of a portion of FIG. 3A in accordance with a number of embodiments of the present disclosure.

A conductive region 320, corresponding to a region 303, may be in semiconductor 304, as shown in FIG. 3B. For example, conductive regions 320-1 and 320-2 may respectively correspond regions 303-1 and 303-2, as shown in FIG. 3A. Vertical portions 328 of semiconductor 304, for example, may be vertical sides 330 of a region 303, such as regions 303-1 and 303-2, as shown in FIG. 3B. A portion of a conductive region 320 may be below a region 303. Portions 332 of a conductive region 320 may extend into each of portions 328 of semiconductor 304 adjacent to a lower portion of each side 330 of a region 303, as shown in FIG. 3B.

A conductive region 335A (FIG. 3B), such as conductive regions 335A1 and 335A2 (FIG. 3A), and a conductive region 335B (FIG. 3B), such as conductive regions 335B1 and 335B2 (FIG. 3A) may be in portions 328 of semiconductor 304. For example, conductive regions 335B1 and 335A2 may be in a portion 328 of semiconductor 304 that is between regions 303-1 and 303-2. The portion 328 that is between regions 303-1 and 303-2 may form a vertical side 330 of region 303-1 to which string 305B1 is adjacent and a vertical side 330 of region 303-2 to which string 305A2 is adjacent, as shown in FIG. 3A.

A conductive region 335A may be associated with a string 305A, and a conductive region 335B may be associated with a string 305B. An upper (e.g. topmost) surface 337 (FIG. 3B) of each of the conductive regions 335 may be co-planar (e.g., flush) with the upper surface of semiconductor 304, and, thus, for example, may be taken to represent the upper surface of semiconductor 304.

In some examples, a string 305A may be between a portion 332 of a conductive region 320 and a conductive region 335A, and a string 305B may be between a portion 332 of a conductive region 320 and a conductive region 335B, as shown in FIG. 3B. Contact 306 may be coupled to conductive region 335A1; contact 307 may be coupled to conductive region 335B2; and a contact 339 may be coupled to conductive regions 335B1 and 335A2 (e.g., contact 339 may couple conductive region 335B1 to conductive region 335A2), as shown in FIG. 3A. The term "coupled" may include directly coupled and/or directly connected with no intervening elements (e.g., by direct physical contact) or indirectly coupled and/or connected with intervening elements.

A first element being adjacent to a second element may include, but not necessarily require, the first element being lateral to the second element (e.g., in the y-direction). The expression lateral to may refer to the horizontal direction (e.g., the y-direction) that may be perpendicular to the vertical direction, for example. A particular element being laterally between two elements may include the particular element being lateral to one of the two elements in a first direction and the other of the two other elements being lateral to the particular element in a second (e.g., opposite) direction. A particular element being vertically between two elements may include the particular element being vertically above one of the two elements and vertically below the other of the two other elements. Elements being vertically separated may include the elements being separated from each other in the vertical direction (e.g., the z-direction), along a vertical line or plane, for example. In some examples, a first element being adjacent to a second element may include, but not necessarily require, the first element being in direct physical contact with the second element. A first element being lateral to a second element may include, but not necessarily require, the first element being in direct physical contact with the second element.

During operation of a string 305, a vertical channel 340 may be formed in a portion 328 of semiconductor 304 adjacent to that string 305 and between a portion 332 of a conductive region 320 and a conductive region 335. For example, when all memory cells 310 in a string 305 are activated (e.g., turned on), a channel 340 may be formed. Channels 340A and 340B may be respectively adjacent to strings 305A and 305B, as shown in FIG. 3B. For example, channels 340A1, 340B1, 340A2, and 340B2 may be respectively adjacent to strings 305A1, 305B1, 305A2, and 305B2, as shown in FIG. 3A. Note that channel 340A in FIG. 3B may correspond to either channel 340A1 or 340A2 in FIG. 3A and that channel 340B in FIG. 3B may correspond to either channel 340B1 or 340B2 in FIG. 3A. Note that channel 340A in FIG. 3B may be between a portion 332 of conductive region 320 and conductive region 335A, and channel 340B in FIG. 3B may be between a portion 332 of conductive region 320 and conductive region 335B.

In some examples, when all of memory cells 310 in each string 305 are activated, a continuous conductive path from conductive region 335A1, and thus contact 306, to conductive region 335B2, and thus contact 307, may be formed. For example, in FIG. 3A, the conductive path may include channel 340A1 from conductive region 335A1 to conductive region 320-1, conductive region 320-1 to channel 340B1, channel 340B1 to conductive region 335B1, conductive region 335B1 to contact 339, contact 339 to conducive region 335A2, conducive region 335A2 to channel 340A2, channel 340A2 to conductive region 320-2, conductive region 320-2 to channel 340B2, and channel 340B2 to conductive region 335B2. For example, strings 305A1, 305B1, 305A2, and 305B2 may be coupled in series between conductive region 335A1 and conductive region 335B2 and may act as a continuous string of series-coupled memory cells. When the select transistors are activated and all of memory cells 310 in each string 305 are activated, for example, a continuous conductive path from the data line to the source may be formed.

Each of strings 305A and 305B may adjacent to a respective vertical side 330 of region 303, as shown in FIG. 3B. Memory cells 310-1 to 310-4 may be best discussed in conjunction with FIG. 3B. The remainder of a region 303, other than memory cells 310-1 to 310-4, may be, as shown in FIG. 3B, a dielectric 345, such as an oxide (e.g., $SiO_2$). For example, dielectric 345 might electrically isolate memory cells 310-1 to 310-4 within a string from each other and may electrically isolate the memory cells in string 305A from the memory cells in string 305B.

In some examples, each of memory cells 310-1 to 310-4 may be a vertical-channel-dual-gate (e.g., split-gate) memory cell that may be adjacent to a respective vertical side 330 of region 303. For example, strings 305, and thus the memory cells 310-1 to 310-4 therein, may be in semiconductor 304 and vertically below the upper surface of semiconductor 304. Each of memory cells 310-1 to 310-4 may include an access gate 350 adjacent to a respective vertical side 330 of a region 303 and a control gate (e.g., a program gate) 355 adjacent to access gate 350. Access gate 350, for example, may be coupled to or form a portion of an access line (e.g., extending perpendicular to the face plane of FIG. 3B), such as a word line. Control gate 355, for example, may be coupled to or form a portion of a control line (e.g., a program line) (e.g., extending perpendicular to the face plane of FIG. 3B).

Access gates 350 and control gates 355 may include one or more conductive materials. In one example, access gates 350 and control gates 355 may be conductively-doped polysilicon, such as n+-doped polysilicon. In another example, access gates 350 and control gates 355 may be metal, such as tungsten or aluminum, or a metal-containing material, such as a metal-containing material on polysilicon, e.g., a refractory metal silicide formed on a conductively-doped polysilicon. The metals of chromium (Cr), cobalt (Co), hafnium (Hf), molybdenum (Mo), niobium (Nb), tantalum (Ta), titanium (Ti), tungsten (W), vanadium (V), zirconium (Zr) are examples of refractory metals. In some examples, the data line might be aluminum, copper, tungsten, etc.

In some examples, an interface dielectric 362 (e.g., that may act as a gate dielectric) may be laterally between access gate 350 and an adjacent portion 328 of semiconductor 304 (e.g., an adjacent vertical side 330 of region 303), as shown in FIG. 3B. For example, interface dielectric 362 may be adjacent to a portion of a vertical side 330 of region 303 (e.g., adjacent to a portion of portion 328 of semiconductor 304). For example, interface dielectric 362 may be lateral to portion 328 of semiconductor 304 in the y-direction. Interface dielectric 362 may be an oxide (e.g., $SiO_2$ or OR-SiON). Access gate 350 may be adjacent to interface dielectric 362 in the y-direction. In some examples, interface dielectric 362 may be direct physical contact with an adjacent portion 328 of semiconductor 304 and access gate 350.

A dielectric 364 (e.g., an oxide, such as $SiO_2$ or HfSiON, etc.) may be between a portion of access gate 350 and a portion of control gate 355, as shown in FIG. 3B, and may capacitively couple access gate 350 to control gate 355. Dielectric 364 may be direct physical contact with access gate 350 and control gate 355, for example. Dielectric 364 may separate access gate 350 from control gate 355, for example.

A dielectric stack 370 (e.g., to store a charge) of a memory cell 310 (e.g., each of memory cells 310-1 to 310-4) may be between control gate 355 and an adjacent portion 328 of semiconductor 304 (e.g., an adjacent vertical side 330 of region 303), as shown in FIG. 3B. For example, a dielectric stack 370 may be adjacent to a portion 328 of semiconductor 304, and, for example, may be lateral to that portion 328 of semiconductor 304 in the y-direction, and, for example, may extend laterally in the y-direction from portion 328 of semiconductor 304 to control gate 355. Dielectric stack 370, for example, may be coupled to a portion 328 of semiconductor 304 and coupled to an interface metallic, such as the interface metallic 220 discussed above in conjunction with FIGS. 2A-2C, that may be coupled to a portion of control gate 355. For example, the interface metallic may couple dielectric stack 370 to the portion of control gate 355. Dielectric stack 370 may be separated from and may be vertically above access gate 350, for example.

In some examples, a dielectric stack 370 of each of memory cells 310-1 to 310-4 may include the dielectric stack 224 (e.g., as discussed above in conjunction with FIGS. 2B, 2D, and 2E and Table 1, for an L3-level memory cell, and FIG. 2B and Table 2 for an L4-level memory cell). In other examples, a dielectric stack 370 of each of memory cells 310-1 to 310-4 may include the dielectric stack 252 (e.g., discussed above in conjunction with FIG. 2C and Table 3 for an L5-level memory cell). In some examples, dielectric 364 might be an extension of the blocking dielectric 218 of dielectric stack 224 (FIG. 2B) or dielectric stack 252 (FIG. 2C).

In examples where a dielectric stack 370 may be dielectric stack 224, interface dielectric 214 (e.g., interface tunnel dielectric) may be adjacent to a vertical side 330 of region 303 and, for example, may be in direct physical contact with that vertical side 330; storage dielectric 226 may be adjacent to interface dielectric 214; tunnel dielectric 227 may be adjacent to storage dielectric 226; charge trap 228 may be adjacent to tunnel dielectric 227; storage dielectric 230 may be adjacent to charge trap 228; and blocking dielectric 218 may be adjacent to storage dielectric 230. The interface metallic may be adjacent to blocking dielectric 218, and thus dielectric stack 224. The control gate 355 may be adjacent to the interface metallic and, for example, may be in direct physical contact with the interface metallic.

In examples where a dielectric stack 370 may be dielectric stack 252, interface dielectric 214 may be adjacent to a vertical side 330 and, for example, may be in direct physical contact with that vertical side 330; storage dielectric 226 may be adjacent to interface dielectric 214; tunnel dielectric 227 may be adjacent to storage dielectric 226; charge trap 228 may be adjacent to tunnel dielectric 227; storage dielectric 230 may be adjacent to charge trap 228; blocking dielectric 255 may be adjacent to storage dielectric 230; and blocking dielectric 218 may be adjacent to blocking dielectric 255. The interface metallic may be adjacent to blocking dielectric 218, and thus dielectric stack 252. The control gate 355 may be adjacent to the interface metallic and, for example, may be in direct physical contact with the interface metallic.

A memory cell 310 (e.g., each of memory cells 310-1 to 310-4), for example, may operate as an L3-level memory cell (e.g., an L3-level USUM memory cell), when the dielectric stack 370 is as described above for an L3-level memory cell, and thus may replace a DRAM memory cell. For example, memory array 300 might be an L3-level memory array. A memory cell 310, for example, may operate as an L4-level memory cell (e.g., an L4-level USUM memory cell) when the dielectric stack 370 is as described above for an L4-level memory cell, and thus may replace a conventional NAND non-volatile memory cell. For example, memory array 300 might be an L4-level memory array. A memory cell 310, for example, may operate as an L5-level memory cell (e.g., an L5-level USUM memory cell) when the dielectric stack 370 is as described above for an L5-level memory cell, and thus may be used in a memory array that may replace a conventional HDD. For example, memory array 300 might be an L5-level memory array. In some examples, an integration scheme similar to (e.g., the same as) that discussed above for the L3-, L4-, and L5-level memory cells and the L3-, L4-, and L5-level memory arrays in conjunction with FIGS. 2B and 2C might be employed to integrate the L3-, L4-, and L5-level memory arrays 300.

In some examples, conductive regions 360, such as source/drains (e.g., conductive regions 360-1 to 360-3), may be in portions 328 of semiconductor 304, as shown in FIG. 3B. In some examples, conductive regions 360 may be formed by conductively doping corresponding portions of portions 328. For example, conductive regions 360 may have an $n^+$-type conductivity.

A conductive region 360, for example, may be adjacent to the dielectric stack 370 of each of memory cells 310-2 to 310-4. A conductive region 335, for example, may be adjacent to the dielectric stack 370 of a memory cell 310-1. For example, as shown in FIG. 3B, a memory cell 310-4 (e.g., the control gate 355 and the access gate 350 of memory cell 310-4) may be between a portion 332 of conductive region 320 and a conductive region 360-3; a memory cell 310-3 (e.g., the control gate 355 and the access gate 350 of memory cell 310-3) may be between conductive regions 360-2 and 360-3; a memory cell 310-2 (e.g., the control gate 355 and the access gate 350 of memory cell 310-2) may be between conductive regions 360-1 and 360-2; and a memory cell 310-1 (e.g., the control gate 355 and the access gate 350 of memory cell 310-1) may be between conductive region 360-1 and a conductive region 335 (e.g., a conductive region 335A or 335B), where the conductive region 335 may act as a source/drain. In some examples, portion 332 of conductive region 320 and a conductive region 360-3 may act as the source/drains of a memory cell 310-4, conductive regions 360-3 and 360-2 the source/drains of a memory cell 310-3, conductive regions 360-2 and 360-1 the source/drains of a memory cell 310-2, and conductive region 360-1 and a conductive region 335 the source/drains of a memory cell 310-1.

The regions (e.g., channel portions) between the conductive regions, for example, may form portions of a channel 340, such as a channel 340A or 340B in FIG. 3B. For example, a channel portion 375-1 (e.g., a channel) of a memory cell 310-1 may be between a conductive region 335 and a conductive region 360-1; a channel portion 375-2 (e.g., a channel) of a memory cell 310-2 may be between a conductive region 360-1 and a conductive region 360-2; a channel portion 375-3 (e.g., a channel) of a memory cell 310-3 may be between a conductive region 360-2 and a conductive region 360-3; and a channel portion 375-4 (e.g., a channel) of a memory cell 310-4 may be between a conductive region 360-3 and conductive region 303, as shown in FIG. 3B In some examples, the access gate 350 and the interface dielectric 362 may form a fixed-threshold-voltage (Vt) portion (e.g., to within routine variations of the threshold voltage) of a memory cell 310 (e.g., each of memory cells 310-1 to 310-4) with a single Vt (e.g., to within routine variations of the Vt). For example, interface dielectric 362 may act as a gate dielectric of the fixed-Vt portion. The portion of control gate 355 coupled to a dielectric stack 370, for example, may form a non-volatile portion the memory cell 310 that may store one or more bits of data. A dielectric stack 370, for example, may be programmed to one of a plurality of states (e.g., data states), where each state corresponds to a different Vt level (e.g., Vt range corresponding to a Vt level due to statistical variation).

For example, the fixed-Vt portion and the non-volatile portion of a memory cell 310 may be coupled in series between the source/drains of that memory cell 310, such as by the channel portion 375 between those source/drains. For example, the fixed-Vt portion may operate as a transistor, such as a FET, and the non-volatile portion may operate as a non-volatile memory cell. For a memory cell 310 to conduct, for example, the fixed-Vt portion may need to be activated in response to a voltage applied to access gate 350 (e.g., causing a portion of the channel portion 375 adjacent to the fixed-Vt portion to conduct) and the non-volatile portion may need to be activated in response to a voltage applied to control gate 355 (e.g., causing a portion of the channel portion 375 adjacent to the non-volatile portion to conduct).

In an example, the fixed Vt portion establishes a lowest memory state, such as an erase state, of a memory cell 310. For example, the fixed-Vt portion may establish a more stable erase state (e.g., with a smaller Vt range) than conventional non-volatile memory cells, such as conventional NAND memory cells. For example, the fixed Vt portion may act to reduce the number of under and/or over erasures that may act to increase the Vt range of the erase state (e.g., thus resulting in a smaller erase Vt range).

The number of data states, and thus the number of threshold voltage ranges, may, for example, be given by $2^n$, where n is the number of bits per the dielectric stack 370. To store n=1 bit in a dielectric stack 370, for example, one of two data states (e.g., including the erase state) may be programmed in that dielectric stack 370, where one bit may correspond (e.g., may be assigned) to each data state. To store n=2 bits in a dielectric stack 370, for example, one of four data states (e.g., including the erase state) may be programmed in that dielectric stack 370, where two bits may correspond to each data state. To store n=3 bits in a dielectric stack 370, for example, one of eight data states (e.g., including the erase state) may be programmed in that dielectric stack 370, where three bits may correspond to each data state. To store n=4 bits in a dielectric stack 370, for example, one of 16 data states (e.g., including the erase state) may be programmed in that dielectric stack 370, where four bits may correspond to each data state, and so on.

Figure 4:
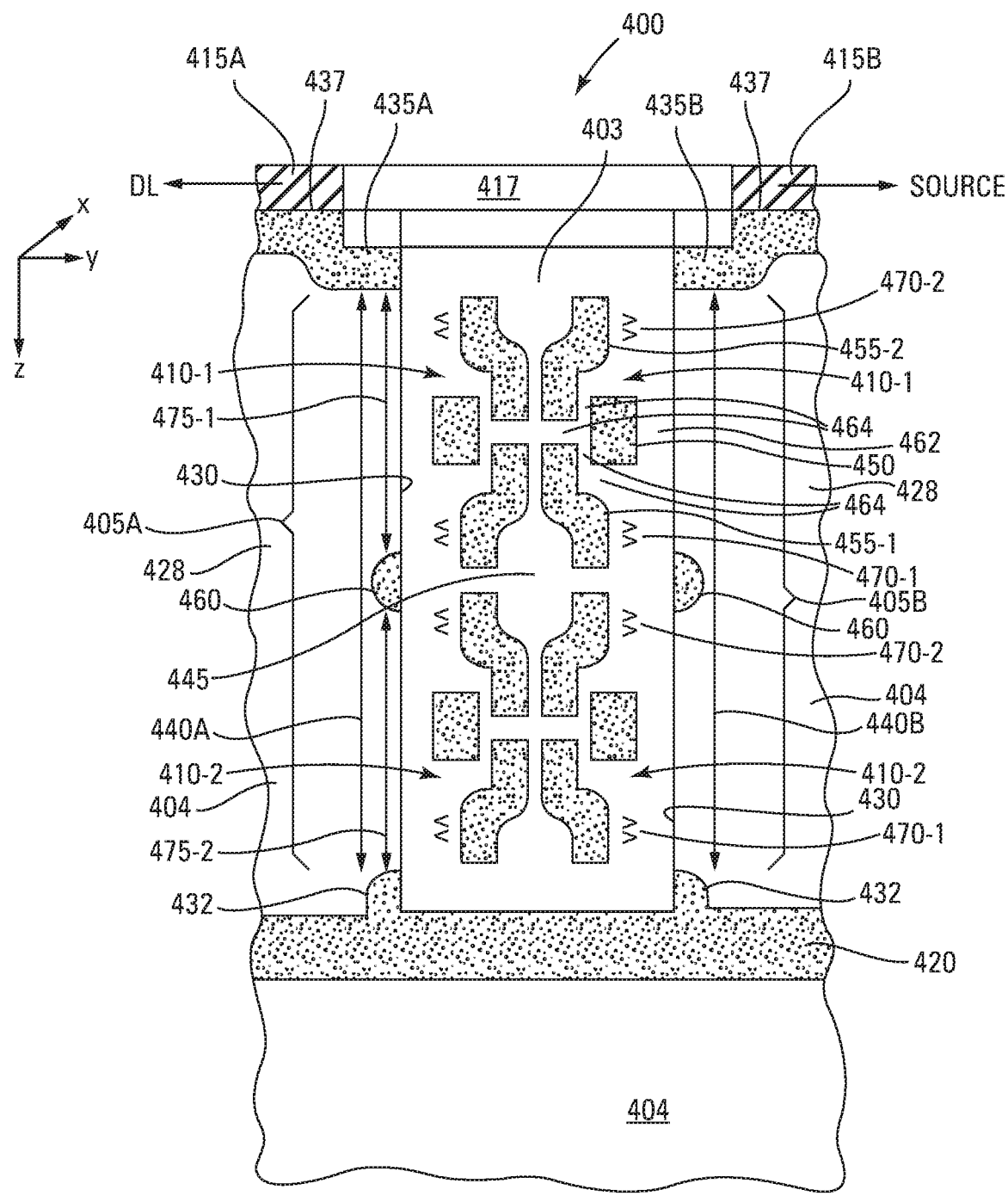
FIG. 4 is cross-sectional view of example of a portion of another memory array in accordance with a number of embodiments of the present disclosure.

FIG. 4 is cross-sectional view of an example of a portion of a memory array 400 that may be included in a memory, such as a memory of electronic system 100 in accordance with a number of embodiments of the present disclosure. For example, memory array 400 may be included in any one of memories 120, 125, and 130 or a memory that may integrate functionalities of memories 120, 125, and 130.

FIG. 4 represents another example of a possible configuration of a (e.g., NAND) string of series-coupled (e.g., vertical channel split-gate) memory cells between a data line DL and a source, where the string channel may be made continuous in the vertical direction through interlinking conductive regions 460 (e.g., diffusion pockets) that may be source/drains of individual split-gate memory cells. A channel length for an individual memory cell may be made long enough in the vertical direction by appropriate selection of the depth of a region 403 (e.g., a trench), and thereby, any short-channel effect of the device may possibly be overcome, for example.

Each individual memory cell may be a triple-gate split-channel memory cell, similar to memory cell 550 in FIG. 5B having a fixed-Vt access gate at the center of each memory cell and an independent variable-Vt memory control gate on either side of the access gate, each capacitively coupled to the access gate, all three gates together may control the (e.g., vertical) channel of the memory cell. The example of FIG. 4 illustrates strings 405A and 405B of series-coupled memory cells, such as string segments, within region 403 interlinked by conductive region 420 (e.g., a buried n+ diffusion) in a semiconductor 404, such as single-crystal p− silicon. In some examples, string 405A, and thus the memory cells therein, and string 405B, and thus the memory cells therein, may be mirror images of each other and may be electrically isolated from each other by a dielectric, such as an oxide.

Memory cell 410-1 of string 405A may be coupled to a conductive region 435A (e.g., a surface diffusion, such as a linking n+ diffusion node) and memory cell 410-1 of string 405B may be coupled to a conductive region 435B (e.g., a surface diffusion, such as a linking n+ diffusion node) in semiconductor 403. In some examples, another region 405 containing strings 405A and 405B may be coupled to each of conductive regions 415A and 415B by a contact, such as contact 339 in FIG. 3, and another conductive region similar to conductive regions 415A and 415B. In some examples, the number of memory cells in each string 405 within region 403 may be increased by increasing the depth of region 403. In some examples, the number of strings in each of regions 403 may be increased in the y-direction, such as by using contacts (e.g., similar to contact 339) between the strings within each of regions 403.

In some examples, a channel, starting from conductive region 435A continues (e.g., downward) through the interlinking conductive region 460 between the memory cells in string 405A, through conductive region 420, and (e.g., upward) through the interlinking conductive region 460 between the memory cells in string 405B to conductive region 435B.

Note that the triple-gate memory cells with two independent dielectric stacks to store charge may have twice the charge storage capacity as the dual-gate memory cells 310 in the examples of FIGS. 3A and 3B. For example, the four memory cells shown may have the equivalent storage capacity as eight of the dual-gate memory cells 310.

Each of strings 405A and 405B may include, for example, series-coupled memory cells 410-1 and 410-2. Region 403 may extend (e.g., vertically), such as in the z-direction, into a semiconductor 404 below an upper (e.g., a topmost) surface of the semiconductor 404. Vertical portions 428 of semiconductor 404, for example, may be vertical sides 430 of a region 403.

A portion of conductive region 420 may be below region 403. Portions 432 of conductive region 420 may extend into each of portions 428 of semiconductor 404 adjacent to a lower portion of each side 430 of region 403.

Conductive regions 435A and 435B may be in portions 428 of semiconductor 404. A conductive region 435A may be coupled to a contact 415A, and a conductive region 435B may be coupled to a contact 415B. An upper (e.g. topmost) surface 437 of each of the conductive regions 435 may be co-planar (e.g., flush) with the upper surface of semiconductor 404, and thus, for example, may be taken to represent the upper surface of semiconductor 404. In some examples, contact 415A may be coupled to data line DL through a select transistor (not shown), and contact 415B may be coupled to the source through a select transistor (not shown).

During operation of a string 405, a vertical channel 440 (e.g., a channel 440A or 440B) may be formed in a portion 428 of semiconductor 404404 adjacent to that string 405 and between conductive region 420 and a conductive region 435. For example, when all memory cells 410 in a string 405 are activated (e.g., turned on), a channel 440 may be formed. Channels 440A and 440B may be respectively adjacent to strings 405A and 405B. Channel 440A may be between a portion 432 of conductive region 420 and conductive region 435A, and channel 440B may be between a portion 432 of conductive region 420 and conductive region 435B.

In some examples, when all of memory cells 410 in each strings 405A and 405B are activated, a continuous conductive path from conductive region 435A, and thus contact 415A, to conductive region 435B, and thus contact 415B, may be formed. For example, the conductive path may include channel 440A from conductive region 435A to conductive region 420, conductive region 420 to channel 440B, and channel 440B to conductive region 435B. For example, strings 405A and 405B may be a continuous string of series-coupled memory cells between conductive region 435A and conductive region 435B. When the select transistors are activated and all of memory cells 410 in each string 405 are activated, for example, a continuous conductive path from the data line to the source may be formed.

Each of strings 405A and 405B may adjacent to a respective vertical side 430 of region 403. The remainder of region 403, other than memory cells 410-1 and 410-2, may be a dielectric 445, such as an oxide (e.g., $SiO_2$). For example, dielectric 445 might electrically isolate memory cells 410-1 and 410-2 within a string from each other and may electrically isolate the memory cells in string 405A from the memory cells in string 405B.

In some examples, each of memory cells 410-1 and 410-2 may be a vertical-channel-triple-gate (e.g., split-gate) memory cell that may be adjacent to (e.g., lateral to) a respective vertical side 430 of region 403. For example, strings 440, and thus the memory cells 410-1 and 410-2 therein, may be vertically below the upper surface of semiconductor 404.

Each of memory cells 410-1 and 410-2 may include a common access gate 450 adjacent to a respective vertical side 430 of region 403 and control gates (e.g., program gates) 455-1 and 455-2 adjacent to access gate 450. Access gate 450, for example, may be coupled to or form a portion of an access line (e.g., extending perpendicular to the face plane of FIG. 4). Control gates 455-1 and 455-2, for example, may be respectively coupled to or respectively form portions of control lines (e.g., extending perpendicular to the face plane of FIG. 4). The materials of access gates 450 and control gates 455 may be similar to (e.g., the same as) the materials of access gates 350 and control gates 355.

In some examples, an interface dielectric 462 may be laterally between access gate 450 and an adjacent portion 428 of semiconductor 404 (e.g., an adjacent vertical side 430 of region 403). For example, interface dielectric 462 may be adjacent to portion 428 of semiconductor 404 in the y-direction. Access gate 450 may be adjacent to interface dielectric 462 in the y-direction. In some examples, interface dielectric 462 may be direct physical contact with an adjacent portion 428 of semiconductor 404 and access gate 450. The material of interface dielectric 462 may be similar to (e.g., the same as) the material of interface dielectric 362.

A dielectric 464 may be between portions of access gate 450 and portions of control gates 455-1 and 455-2 and may capacitively couple access gate 450 to control gates 455-1 and 455-2. Dielectric 464 may be in direct physical contact with access gate 450 and control gates 455-1 and 455-2, for example. Dielectric 464 may be between control gate 455-1 and control gate 455-2 and may electrically isolate control gate 455-1 from control gate 455-2. Control gate 455-1 may be separate from control gate 455-2, for example. The material of dielectric 464 may be similar to (e.g., the same as) the material of dielectric 364.

Control gate 455-1 might wrap around a portion of access gate 450, in some examples, so that a lower portion of control gate 455-1 is vertically below at least a portion of a lower (e.g., bottommost) edge of access gate 450. Control gate 455-2 might wrap around another portion of access gate 450, in some examples, so that an upper portion of control gate 455-2 is vertically above at least a portion of an upper (e.g., topmost) edge of access gate 450, where the upper edge of access gate 450 is vertically above the lower edge of access gate 450. For example, access gate 450 may be vertically between the lower portion of control gate 455-1 and the upper portion of control gate 455-2. The control gate 455-2 of a memory cell 410 may be vertically above the control gate 455-1 of that memory cell 410, for example.

A dielectric stack 470 of a memory cell 410 (e.g., each of memory cells 410-1 and 410-2) may be on either side of the access gate 450 and between the control gate 455-1 and an adjacent portion 428 of semiconductor 404 (e.g., an adjacent vertical side 430 of region 403) and the control gate 455-2 and an adjacent portion 428 of semiconductor 404. For example, lower dielectric stack 470-1 and upper dielectric stack 470-2 may be adjacent to a portion 428 of semiconductor 404 in the y-direction, and, for example, may extend laterally in the y-direction from the portion 428 of semiconductor 404 respectively to the control gates 455-1 and 455-2.

Upper dielectric stack 470-2 may be vertically above (e.g., and vertically separated from) from lower dielectric stack 470-1. For example, the lower dielectric stack 470-1 of a memory cell 410 may be vertically below the lower edge of the access gate 450 of that memory cell 410 and laterally between portion 428 and the lower portion of the control gate 455-1 of that memory cell 410, and an upper dielectric stack 470-2 may be vertically above the upper edge of access gate 450 and laterally between portion 428 and the upper portion of control gate 455-2. For example, access gate 450 and interface dielectric 462 may be vertically between lower dielectric stack 470-1 and upper dielectric stack 470-2.

The lower dielectric stack 470-1, for example, may be coupled to portion 428 of semiconductor 404 and coupled to an interface metallic, such as the interface metallic 220 discussed above in conjunction with FIGS. 2A-2C, that may be coupled to the lower portion of control gate 455-1. For example, the interface metallic may couple dielectric stack 470-1 to the lower portion of control gate 455-1. The upper dielectric stack 470-2, for example, may be coupled to portion 428 and coupled to an interface metallic, such as the interface metallic 220, that may be coupled to the upper portion of control gate 455-2. For example, the interface metallic may couple dielectric stack 470-2 to the upper portion of control gate 455-2. In some examples, the upper dielectric stack 470-2 may extend laterally in the y-direction from portion 428 to the interface metallic coupled to the upper portion of control gate 455-2, and thus may be laterally between portion 428 and the interface metallic, and thus the upper portion of control gate 455-2, and the lower dielectric stack 470-1 may extend laterally in the y-direction from portion 428 to the interface metallic coupled to the lower portion of control gate 455-1, and thus may be laterally between portion 428 and the interface metallic, and thus the lower portion of a control gate 455-1.

In some examples, lower dielectric stack 470-1 and upper dielectric stack 470-2 may be to store a charge. For example, lower dielectric stack 470-1 and upper dielectric stack 470-2 may be as described above for the dielectric stack 370. For example, a dielectric stack 224 or a dielectric stack 252 may be laterally between portion 428 and the interface metallic coupled to the lower portion of the control gate 455-1, where the interface dielectric 214 of either dielectric stack 224 or dielectric stack 252 may be in direct physical contact with portion 428 and the blocking dielectric 218 of either dielectric stack 224 or dielectric stack 252 may be in direct physical contact with the interface metallic coupled to the lower portion of control gate 455-1. Note, for example, that the interface metallic may be laterally between the lower portion of control gate 455-1 and the blocking dielectric 218 of dielectric stack 224 or dielectric stack 252.

A dielectric stack 224 or a dielectric stack 252 may be laterally between portion 428 and the interface metallic coupled to the upper portion of the control gate 455-2, for example, where the interface dielectric 214 of either dielectric stack 224 or dielectric stack 252 may be in direct physical contact with portion 428 and the blocking dielectric 218 of either dielectric stack 224 or dielectric stack 252 may be in direct physical contact with the interface metallic coupled to the upper portion of the control gate 455-2. Note, for example, that the interface metallic may be laterally between the upper portion of the control gate 455-2 and the blocking dielectric 218 of dielectric stack 224 or dielectric stack 252. In some examples, dielectric 464 might be might be an extension of the blocking dielectric 218 of dielectric stack 224 (FIG. 2B) or dielectric stack 252 (FIG. 2C).

A memory cell 410 (e.g., each of memory cells 410-1 and 410-2), for example, may operate as an L3-level memory cell (e.g., an L3-level USUM memory cell), for examples where the dielectric stacks 470-1 and 470-2 are as described above for an L3-level memory cell, and thus may replace a DRAM memory cell. For example, memory array 400 might be an L3-level memory array. A memory cell 410, for example, may operate as an L4-level memory cell (e.g., an L4-level USUM memory cell) for examples where the dielectric stacks 470-1 and 470-2 are as described above for an L4-level memory cell, and thus may replace a conventional NAND non-volatile memory cell. For example, memory array 400 might be an L4-level memory array. A memory cell 410, for example, may operate as an L5-level memory cell (e.g., an L5-level USUM memory cell) for examples where the dielectric stacks 470-1 and 470-2 are as described above for an L5-level memory cell, and thus may be used in a memory array that may replace a conventional HDD. For example, memory array 400 might be an L5-level memory array. In some examples, an integration scheme similar to (e.g., the same as) that discussed above for the L3-, L4-, and L5-level memory cells and the L3-, L4-, and L5-level memory arrays in conjunction with FIGS. 2B and 2C might be employed to integrate L3-, L4-, and L5-level memory arrays 400.

In some examples, conductive regions 460, such as source/drains, may be in portions 428 of semiconductor 404 and may be as described above for conductive regions 360, for example. A conductive region 460, for example, may be adjacent to the lower dielectric stack 470-1 of a memory cell 410-1 and the upper dielectric stack 470-2 of a memory cell 410-2. For example, a memory cell 410-2 (e.g., the control gate 455-1, the access gate 450, and the control gate 455-2 of memory cell 410-2) may be between a portion 432 of conductive region 420 and a conductive region 460, and a memory cell 410-1 (e.g., the control gate 455-1, the access gate 450, and the control gate 455-2 of memory cell 410-1) may be between conductive region 460 and a conductive region 435 (e.g., conductive region 435A or 435B). In some examples, portion 432 of conductive region 420 and a conductive region 460 may act as the source/drains of a memory cell 410-2, and conductive region 460 and a conductive region 435 may act as the source/drains of a memory cell 410-1.

The regions (e.g., channel portions) between the conductive region, for example, may form portions of a channel 440, such as a channel 440A or 440B. For example, a channel portion 475-1 (e.g., a channel) of a memory cell 410-1 may be between a conductive region 435 and a conductive region 460, and a channel portion 475-2 (e.g., a channel) of a memory cell 410-2 may be between the conductive region 460 and conductive region 420. It should be noted, for example, that the conductive regions) described above may serve as interchangeable sources and drains for programming and sensing the memory states for the above triple-gated memory cells.

In some examples, the access gate 450 and the interface dielectric 462 may form a fixed-Vt portion (e.g., to within routine variations of the threshold voltage) of a memory cell 410 (e.g., each of memory cells 410-1 and 410-2) with a single Vt (e.g., to within routine variations of the Vt), where, for example, interface dielectric 462 may act as a gate dielectric of the fixed-Vt portion. The upper portion of control gate 455-2, the upper dielectric stack 470-2, and the interface metallic therebetween, for example, may form an upper non-volatile portion of the memory cell 410 that may store one or more bits of data. The lower portion of control gate 455-1, the lower dielectric stack 470-1, and the interface metallic therebetween, for example, may form a lower non-volatile portion of the memory cell 410 that may store one or more bits of data. For example, the fixed-Vt portion may be vertically between the upper and lower non-volatile portions.

The lower dielectric stack 470-1 and upper dielectric stack 470-2 of a memory cell 410, for example, may each be programmed to one of a plurality of states (e.g., data states), where each state corresponds to a different Vt level. The lower dielectric stack 470-1 may be to store either a different data state than upper dielectric stack 470-2 or to store the same data state as upper dielectric stack 470-2.

For example, the fixed-Vt portion and the non-volatile portions of a memory cell 410 may be coupled in series between the conductive regions acting as source/drains of that memory cell 410, such as by the channel portion 475 between those conductive regions. For example, the fixed-Vt portion may operate as a transistor, such as a FET, and the non-volatile portions may operate as non-volatile memory cells. For a memory cell 410 to conduct, for example, the fixed-Vt portion may need to be activated in response to a voltage applied to access gate 450 (e.g., causing a portion of the channel portion 475 adjacent to the fixed-Vt portion to conduct) and the non-volatile portions may need to be activated in response to voltages applied to control gates 455-1 and 455-2 (e.g., causing portions of the channel portion 475 adjacent to those non-volatile portions to conduct).

In an example, the fixed Vt portion establishes a lowest state, such as an erase state, of a memory cell 410. For example, the fixed-Vt portion may establish a more stable erase state (e.g., with a smaller Vt range) than conventional non-volatile memory cells, such as conventional NAND memory cells. For example, the fixed Vt portion may act to reduce the number of under and/or over erasures that may act to increase the Vt range of the erase state (e.g., thus resulting in a smaller erase Vt range).

The number of data states, and thus the number of threshold voltage ranges, may, for example, be given by $2^n$, where n is the number of bits per the lower dielectric stack 470-1 and/or the upper dielectric stack 470-2. This means, for example, that each memory cell 410 may have an increased bit density and may store 2n bits, n bits for each dielectric stack. Dielectric stacks 470-1 and 470-2, and thus non-volatile portions corresponding thereto, may store one or more bits, such as described above for memory cell 200 in conjunction with FIG. 2A.

The density of some memory arrays, for example, may be defined in an x-y plane, such as the plane of the upper surface of semiconductor 303 or 403, and increased densities may be realized by scaling down feature sizes, such as memory cell features, in the x-y plane. However, as memory cells are scaled down to about below about 50 nanometers, for example, the channel length might decrease to a point where the memory cells may become inoperable. This may be referred to as a short-channel effect, for example.

By forming memory cells 310 and 410 vertically in the z-direction, for example, short-channel effects might be reduced (e.g., eliminated) without increasing the density of the memory array in the x-y plane. For example, memory arrays 300 and 400 may be scaled down to have about five nanometer feature sizes in the x-y plane, e.g., with little or no change in the channel length in the z-direction, thereby possibly avoiding short-channel effects.

The L3-, L4-, and L5-level memory cells described above may be respectively in L3, L4, and L5 NAND memory arrays. For example, the L3, L4, and L5 memory arrays discussed above in conjunction with memory array 300 or 400 may respectively be L3, L3, and L5 sub-arrays within a single NAND memory array that may be included in a memory that may, for example, integrate functionalities of memories 120, 125, and 130. Advantageously, in such an array, for example, sensing and programming schemes may be similar and data transfer to the processor may be parallel with higher bandwidth. Unlike in conventional memory hierarchy designs, for example, data-transfer-induced latency to avoid conflicts in data transfer from conventional separate L3-, L4-, and L5-level arrays may be avoided, and thus the large number of "wait" clock cycles and the logic overhead delay and energy consumption associated with such conflicts may be reduced.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A memory, comprising:
a first group of series-coupled memory cells and a second group of series-coupled memory cells contained within a trench into a semiconductor, wherein the trench extends below and perpendicular to an upper surface of a semiconductor;
wherein the first group and the second group are respectively adjacent to respective portions of the semiconductor that respectively form sides of the trench;
wherein each memory cell in the first group and each memory cell in the second group comprises:
an access gate;
a control gate coupled to the access gate; and
a dielectric stack between the control gate and the respective portion of the semiconductor, the dielectric stack to store a charge.

2. The memory of claim 1, wherein the control gate is a first control gate and the dielectric stack is a first dielectric stack, and further comprising:
a second control gate separate from the first control gate and coupled to the access gate; and
a second dielectric stack between the second control gate and the respective portion of the semiconductor, the second dielectric stack to store a charge.

3. The memory of claim 2, wherein the first dielectric stack comprises a first storage dielectric, a first tunneling layer between the first storage dielectric and the semiconductor, a second storage dielectric, and a second tunneling layer between the second storage dielectric and the first storage dielectric.

4. The memory of claim 2, wherein the first group is coupled in series with the second group, wherein the respective portion of the semiconductor to which the first group is adjacent comprises a first conductive region coupleable to a data line, wherein the respective portion of the semiconductor to which the second group is adjacent comprises a second conductive region coupleable to a source.

5. The memory of claim 1, further comprising:
a first conductive region in the respective portion of the semiconductor to which the first group is adjacent, the first conductive region adjacent to the dielectric stack of a first memory cell in the first group;
a second conductive region that couples the first and second groups in series; and
a third conductive region in the respective portion of the semiconductor to which the first group is adjacent and between the first and second conductive regions;
wherein the third conductive region is adjacent to the dielectric stack of a second memory cell in the first group that is between the first memory cell in the first group and the second conductive region.

6. The memory of claim 1, wherein the trench that extends into the semiconductor is a first trench that extends into the semiconductor, wherein the first group and the second group are coupled in series, and further comprising:
a third group of series-coupled memory cells and a fourth group of series-coupled memory cells in a second trench that extends into a semiconductor;
wherein the third group and the fourth group are respectively adjacent to respective portions of the semiconductor that respectively form sides of the second trench; and
wherein the second group is coupled in series with the third group and the third group is coupled in series with the fourth group.

7. A method of forming a memory, comprising:
forming a first group of series coupled memory cells and a second group of series coupled memory cells contained within a trench extending within a semiconductor below and perpendicular to an upper surface of a semiconductor, wherein portions of the semiconductor extending perpendicular to and below the upper surface of the semiconductor define sidewalls of the trench, and wherein the first group of series coupled memory cells and the second group of series coupled memory cells are respectively adjacent to a respective portion of the portions of the semiconductor defining the sidewalls of the trench,
wherein forming each memory cell in the first group and each memory cell in the second group comprises:
forming an access gate;
forming a control gate coupled to the access gate; and
forming a dielectric stack between the control gate and the respective portion of the semiconductor, the dielectric stack to store a charge.

8. The method of claim 7, wherein forming the control gate includes forming a first control gate and further comprising forming a second control gate separate from the first control gate and coupled to the access gate.

9. The method of claim 8, wherein forming the dielectric stack includes forming a first dielectric stack and further comprising forming a second dielectric stack between the second control gate and the respective portion of the semiconductor, the second dielectric stack to store a charge.

10. The method of claim 9, wherein forming the first dielectric stack comprises forming a first storage dielectric, forming a first tunneling layer between the first storage dielectric and the semiconductor, forming a second storage dielectric, and forming a second tunneling layer between the second storage dielectric and the first storage dielectric.

11. The method of claim 9, wherein forming the first group of series coupled memory cells includes forming the first group of series coupled memory cells coupled in series with the second group, wherein the respective portion of the semiconductor to which the first group is adjacent comprises a first conductive region coupled to a data line, wherein the respective portion of the semiconductor to which the second group is adjacent comprises a second conductive region coupled to a source.

12. The method of claim 7, further comprising:
forming a first conductive region in the respective portion of the semiconductor to which the first group is adjacent, the first conductive region adjacent to the dielectric stack of a first memory cell in the first group;
forming a second conductive region that couples the first and second groups in series; and
forming a third conductive region in the respective portion of the semiconductor to which the first group is adjacent and between the first and second conductive regions;
wherein forming the third conductive region includes forming the third conductive region adjacent to the dielectric stack of a second memory cell in the first group that is formed between the first memory cell in the first group and the second conductive region.

13. The method of claim 7, wherein forming the first group of series coupled memory cells includes forming the first group of series coupled memory cells coupled in series with the second group of series coupled memory cells, wherein the trench that extends into the semiconductor is a first trench that extends into the semiconductor, and further comprising:
forming a third group of series-coupled memory cells and forming a fourth group of series-coupled memory cells in a second trench that extends into a semiconductor;
wherein forming the third group and the fourth group includes forming the third and fourth group respectively adjacent to respective portions of the semiconductor that respectively form sides of the second trench; and
wherein forming the second group includes forming the second group coupled in series with the third group and wherein forming the third group includes forming the third group coupled in series with the fourth group.

14. A memory, comprising:
a first group of series-coupled memory cells coupled in series to a second group of series-coupled memory cells contained within a region that extends into a semiconductor below and perpendicular to an upper surface of the semiconductor, wherein portions of the semiconductor extend below and perpendicular to the upper surface of the semiconductor and define sidewalls of the region;
wherein the first group is a first string of memory cells and the second group is a second string of memory cells, and wherein the first string of memory cells and the second string of memory cells are respectively adjacent to and oriented parallel to a respective portion of the portions of the semiconductor that define the sidewalls of the region;
wherein each memory cell in the first group and each memory cell in the second group comprises:
an access gate;
a control gate coupled to the access gate; and
a dielectric stack between the control gate and an adjacent portion of the semiconductor, the dielectric stack to store a charge.

15. The memory of claim 14, wherein the control gate is a first control gate and the dielectric stack is a first dielectric stack, and further comprising:
a second control gate separate from the first control gate and coupled to the access gate; and
a second dielectric stack between the second control gate and an adjacent portion of the semiconductor, the second dielectric stack to store a charge.

16. The memory of claim 15, wherein the access gate, the first control gate, and the second control gate are operable to control a channel of the each memory cell.

17. The memory of claim 15, wherein the first dielectric stack comprises a first storage dielectric, a first tunneling layer between the first storage dielectric and the semiconductor, a second storage dielectric, and a second tunneling layer between the second storage dielectric and the first storage dielectric.

18. The memory of claim 15, wherein the portion of the semiconductor adjacent to the first group comprises a first conductive region coupleable to a data line, wherein the portion of the semiconductor adjacent to the second group comprises a second conductive region coupleable to a source.

19. The memory of claim 14, further comprising:
a first conductive region in the portion of the semiconductor adjacent the first group, the first conductive region adjacent to the dielectric stack of a first memory cell in the first group;
a second conductive region that couples the first and second groups in series; and
a third conductive region in the respective portion of the semiconductor to which the first group is adjacent and between the first and second conductive regions;
wherein the third conductive region is adjacent to the dielectric stack of a second memory cell in the first group that is between the first memory cell in the first group and the second conductive region.

20. The memory of claim 14, wherein the region that extends into the semiconductor is a first region that extends into the semiconductor, wherein the first group and the second group are coupled in series, and further comprising:
a third group of series-coupled memory cells and a fourth group of series-coupled memory cells in a second region that extends into a semiconductor;
wherein the third group and the fourth group are respectively adjacent to respective portions of the semiconductor that respectively form sides of the second region; and wherein the second group is coupled in series with the third group and the third group is coupled in series with the fourth group.

* * * * *